(12) United States Patent
Han et al.

(10) Patent No.: US 12,527,175 B2
(45) Date of Patent: Jan. 13, 2026

(54) DISPLAY SUBSTRATE AND DISPLAY DEVICE

(71) Applicants: Chengdu BOE Optoelectronics Technology Co., Ltd., Sichuan (CN); BOE Technology Group Co., Ltd., Beijing (CN)

(72) Inventors: Linhong Han, Beijing (CN); Yi Zhang, Beijing (CN)

(73) Assignees: Chengdu BOE Optoelectronics Technology Co., Ltd., Sichuan (CN); BOE Technology Group Co., Ltd., Beijing (CN)

( * ) Notice: Subject to any disclaimer, the term of this patent is extended or adjusted under 35 U.S.C. 154(b) by 749 days.

(21) Appl. No.: 17/795,066

(22) PCT Filed: Aug. 6, 2021

(86) PCT No.: PCT/CN2021/111224
§ 371 (c)(1),
(2) Date: Jul. 25, 2022

(87) PCT Pub. No.: WO2022/057508
PCT Pub. Date: Mar. 24, 2022

(65) Prior Publication Data
US 2023/0146897 A1    May 11, 2023

(30) Foreign Application Priority Data

Sep. 16, 2020    (CN) .................. 202010976764.X

(51) Int. Cl.
*H10K 59/131*    (2023.01)
*G11C 19/28*    (2006.01)
(Continued)

(52) U.S. Cl.
CPC .......... *H10K 59/131* (2023.02); *G11C 19/28* (2013.01); *H10K 59/1213* (2023.02);
(Continued)

(58) Field of Classification Search
CPC .... H10K 59/873; H10K 59/12; H01L 23/562; H01L 23/564; H01L 23/573; H01L 23/576
(Continued)

(56) References Cited

U.S. PATENT DOCUMENTS 10,249,697 B2 *   4/2019   Chen .................... H10K 59/131
10,861,361 B2 *   12/2020  Kim ..................... G09G 3/3225
(Continued)

FOREIGN PATENT DOCUMENTS

CN    109979366 A       7/2019
CN    110233161 A  *    9/2019   ......... H01L 27/3244
(Continued)

*Primary Examiner* — Bumsuk Won
(74) *Attorney, Agent, or Firm* — IPro, PLLC

(57) ABSTRACT

A display substrate and a display device. The display substrate includes: a base substrate, which comprises a display region, a peripheral region and a barrier region, where the peripheral region surrounds the display region, and the display region surrounds the barrier region; a through hole located in the barrier region, the center of the display substrate not coinciding with the center of the through hole; a plurality of sub-pixels located in the display region; a plurality of signal lines that are located in the display region, the peripheral region and the barrier region, and are electrically connected to the plurality of sub-pixels; a shift register circuit that is located in the peripheral region and is electrically connected to the plurality of signal lines; and at least one circle of crack detection lines that are located in the barrier region and surround the through hole.

19 Claims, 16 Drawing Sheets

(51) Int. Cl.
    *H10K 59/121*     (2023.01)
    *H10K 59/65*     (2023.01)
    *H10K 59/80*     (2023.01)
    *H10K 59/12*     (2023.01)

(52) U.S. Cl.
    CPC ....... *H10K 59/1216* (2023.02); *H10K 59/873* (2023.02); *H10K 59/12* (2023.02); *H10K 59/65* (2023.02); *H10K 59/8731* (2023.02)

(58) Field of Classification Search
    USPC .......................................................... 257/40
    See application file for complete search history.

(56) References Cited

U.S. PATENT DOCUMENTS

| | | | |
|---|---|---|---|
| 11,263,936 B2 * | 3/2022 | Lee | H05K 3/42 |
| 12,178,065 B2 * | 12/2024 | Kim | H10K 50/8445 |
| 2020/0278312 A1 * | 9/2020 | Jeong | H10K 59/00 |
| 2021/0210713 A1 * | 7/2021 | Li | H10K 59/122 |
| 2021/0248938 A1 | 8/2021 | Lee et al. | |
| 2021/0359069 A1 * | 11/2021 | Wang | H10K 59/131 |
| 2021/0384225 A1 | 12/2021 | Zhang et al. | |
| 2022/0122538 A1 * | 4/2022 | Furukawa | G09G 3/3266 |

FOREIGN PATENT DOCUMENTS

| | | |
|---|---|---|
| CN | 110264891 A | 9/2019 |
| CN | 110780501 A | 2/2020 |
| CN | 111146261 A | 5/2020 |
| CN | 111429849 A | 7/2020 |
| WO | 2019235823 A1 | 12/2019 |

\* cited by examiner

DISPLAY SUBSTRATE AND DISPLAY DEVICE

CROSS REFERENCE TO RELATED APPLICATIONS

The present application is a US National Stage of International Application No. PCT/CN2021/111224, filed on Aug. 6, 2021, which claims priority to the Chinese Patent Application No. 202010976764.X, filed to the China Patent Office on Sep. 16, 2020 and entitled "DISPLAY SUBSTRATE AND FABRICATION METHOD THEREOF, AND DISPLAY DEVICE", the contents of which should be constructed as being incorporated herein by reference.

FIELD

Embodiments of the present disclosure relate to but are not limited to the field of display, in particular to a display substrate and a display apparatus.

BACKGROUND

At present, a display screen of a display device is developing in a tendency to a large screen and a full screen. In general, the display device (for example, a mobile phone and a tablet computer) has a camera apparatus (or an imaging apparatus), for example, the camera apparatus can be combined with a display region of the display screen, a position is reserved for the camera apparatus in the display region by punching a hole, and thus maximization of the display region of the display screen is obtained. However, in a production process of a display panel, a crack is prone to occurring in a punching position; signal disconnection, encapsulation failure and the like of the display panel are caused; and finally abnormal displaying is caused.

A panel crack detection (PCD) technology has been widely applied to detection of the display panel. An existing crack detection technology needs to occupy a certain position at a cutting edge of the display screen, which affects maximization of the display region of the display screen.

SUMMARY

At least one embodiment of the present disclosure provides a display substrate, including:
- a base substrate, including a display region, a peripheral region and a barrier region; where the peripheral region surrounds the display region, and the display region surrounds the barrier region;
- a through hole, located in the barrier region; where a center of the display substrate does not coincide with a center of the through hole;
- a plurality of sub-pixels, located in the display region;
- a plurality of signal lines, located in the display region, the peripheral region and the barrier region; where the plurality of signal lines are electrically connected to the plurality of sub-pixels, where the plurality of signal lines include a first signal line;
- a shift register circuit, located in the peripheral region and electrically connected to the plurality of signal lines; and
- at least one circle of crack detection lines, located in the barrier region and surrounding the through hole; where the at least one circle of crack detection lines are electrically connected to the first signal line, and the first signal line is electrically connected to at least one sub-pixel in the plurality of sub-pixels.

In some exemplary implementations, in the display substrate provided by at least one embodiment of the present disclosure, the shift register circuit includes a plurality of shift register units, and the first signal line is electrically connected to one of the plurality of shift register units.

In some exemplary implementations, in the display substrate provided by at least one embodiment of the present disclosure, the shift register circuit is a gate shift register circuit, and the first signal line is a scanning signal line; or
the shift register circuit is a light-emitting control shift register circuit, and the first signal line is a light-emitting control signal line.

In some exemplary implementations, the display substrate provided by at least one embodiment of the present disclosure further includes at least one first lap joint structure; where the first signal line is electrically connected to the at least one circle of crack detection lines through the at least one first lap joint structure, and the at least one first lap joint structure and the at least one circle of crack detection lines are located on different layers and electrically connected through a via hole.

In some exemplary implementations, in the display substrate provided by at least one embodiment of the present disclosure, the quantity of first lap joint structures is two, the first signal line includes a first routing sub-wire and a second routing sub-wire, and the two first lap joint structures are electrically connected to the first routing sub-wire and a first end of the at least one circle of crack detection lines as well as the second routing sub-wire and a second end of the at least one circle of crack detection lines respectively.

In some exemplary implementations, in the display substrate provided by at least one embodiment of the present disclosure, the quantity of circles of crack detection lines is multiple, and the multiple circles of crack detection lines are continuous routing wires and surround the through hole.

In some exemplary implementations, the display substrate provided by the at least one embodiment of the present disclosure further includes at least one second lap joint structure, wherein two adjacent circles of crack detection lines are electrically connected to each other through the at least one second lap joint structure, and the at least one second lap joint structure and the two adjacent circles of crack detection lines are located on different layers and electrically connected through a via hole.

In some exemplary implementations, in the display substrate provided by at least one embodiment of the present disclosure, the quantity of circles of crack detection lines is four; the crack detection lines respectively include, in a radial direction approaching the center of the through hole, a first detection routing sub-wire, a second detection routing sub-wire, a third detection routing sub-wire and a fourth detection routing sub-wire; the first detection routing sub-wire and the second detection routing sub-wire are electrically connected through one second lap joint structure; and any two of the second detection routing sub-wire, the third detection routing sub-wire and the fourth detection routing sub-wire are electrically connected through two second lap joint structures.

In some exemplary implementations, the display substrate provided by at least one embodiment of the present disclosure further includes a first multi-layer insulation layer located on a side of the base substrate, where the at least one circle of crack detection lines are located on a side, away from the base substrate, of the first multi-layer insulation layer.

In some exemplary implementations, the display substrate provided by at least one embodiment of the present disclosure further includes: a first organic functional layer located on a side, away from the base substrate, of the at least one circle of crack detection lines; and a second organic functional layer located on a side, away from the base substrate, of the first multi-layer insulation layer; where the first organic functional layer and the second organic functional layer are arranged intermittently, and an orthographic projection of the first organic functional layer on the base substrate does not overlap with an orthographic projection of the second organic functional layer on the base substrate.

In some exemplary implementations, in the display substrate provided by at least one embodiment of the present disclosure, the at least one circle of crack detection lines include a first sub-layer, a second sub-layer and a third sub-layer sequentially located on a side, away from the base substrate, of the first multi-layer insulation layer; and an orthographic projection of the second sub-layer on the base substrate is located in orthographic projections of the first sub-layer and the third sub-layer on the base substrate.

In some exemplary implementations, in the display substrate provided by at least one embodiment of the present disclosure, at least one side surface of the at least one circle of crack detection lines surrounding the through hole has a notch.

In some exemplary implementations, in the display substrate provided by at least one embodiment of the present disclosure, at least one of the plurality of sub-pixels includes: a thin-film transistor, a storage capacitor and a light-emitting device;
  where the thin-film transistor comprises: an active layer, arranged on the base substrate; a gate, arranged on a side, away from the base substrate, of the active layer; a first insulation layer, arranged on a side, away from the base substrate, of the gate; a second insulation layer, arranged on a side, away from the base substrate, of the first insulation layer; and a source and a drain, arranged on a side, away from the base substrate, of the second insulation layer and electrically connected to the active layer;
  where the storage capacitor comprises: a first polar plate, arranged on a same layer as the gate; and a second polar plate, arranged between the first insulation layer and the second insulation layer;
  where the light-emitting device comprises: an anode layer, arranged on a side, away from the base substrate, of the source and the drain; an organic functional layer, arranged on a side, away from the base substrate, of the anode layer; and a cathode layer, arranged on a side, away from the base substrate, of the organic functional layer.

In some exemplary implementations, in the display substrate provided by at least one embodiment of the present disclosure, the at least one circle of crack detection lines and the source or the drain are located on the same layer;
  the first multi-layer insulation layer at least includes the first insulation layer and the second insulation layer; and
  the second lap joint structure and the first lap joint structure are located on the same layer as the second polar plate.

In some exemplary implementations, in the display substrate provided by at least one embodiment of the present disclosure, materials of the first organic functional layer and the second organic functional layer are the same.

In some exemplary implementations, the display substrate provided by at least one embodiment of the present disclosure further includes at least one groove, where the at least one groove penetrates through the first insulation layer and at least a part of the second insulation layer, and an orthographic projection of the groove on the base substrate does not overlap with an orthographic projection of the at least one circle of crack detection lines on the base substrate.

In some exemplary implementations, the display substrate provided by at least one embodiment of the present disclosure further includes at least one circle of intercept wall located in a direction of the at least one circle of crack detection lines approaching the through hole, and the at least one circle of intercept wall is configured to block an organic encapsulation layer for encapsulating the plurality of sub-pixels.

In some exemplary implementations, in the display substrate provided by at least one embodiment of the present disclosure, the at least one circle of intercept wall includes a first intercept wall and a second intercept wall; the first intercept wall is located on a side, away from the through hole, of the second intercept wall; and a largest height of the first intercept wall in a direction perpendicular to the base substrate is smaller than a largest height of the second intercept wall in the direction perpendicular to the base substrate.

In some exemplary implementations, the display substrate provided by at least one embodiment of the present disclosure further includes at least one circle of crack blocking wall located on a side, close to the through hole, of the at least one circle of intercept wall.

In some exemplary implementations, the display substrate provided by at least one embodiment of the present disclosure further includes an encapsulation layer; where the encapsulation layer at least encapsulates a barrier wall; and the encapsulation layer includes a first inorganic encapsulation layer, a first organic encapsulation layer and a second inorganic encapsulation layer sequentially arranged on the at least one circle of crack detection lines in stack.

In some exemplary implementations, the display substrate provided by at least one embodiment of the present disclosure further includes an image sensor and/or an infrared sensor, where the image sensor and/or the infrared sensor is combined with the base substrate, and an orthographic projection of the image sensor and/or the infrared sensor on the base substrate at least partially overlaps with the through hole.

An embodiment of the present disclosure further provides a display apparatus, including the display substrate of the above embodiments.

Embodiment of the present disclosure further provides a fabrication method of a display substrate, including: forming a base substrate, where the base substrate includes a display region, a peripheral region and a barrier region, the peripheral region surrounds the display region, and the display region surrounds the barrier region; a through hole, located in the barrier region, where a center of the display substrate does not coincide with a center of the through hole; a plurality of sub-pixels, located in the display region; a plurality of signal lines, located in the display region, the peripheral region and the barrier region and electrically connected to the plurality of sub-pixels, where the plurality of signal lines include a first signal line; a shift register circuit, located in the peripheral region and electrically connected to the plurality of signal lines; and at least one circle of crack detection lines, located in the barrier region and surrounding the through hole, where the at least one circle of crack detection lines are electrically connected to the first signal line, and the first signal line is electrically connected to at least one sub-pixel in the plurality of sub-pixels.

Other aspects can be understood after reading and comprehending the accompanying drawings and the detailed description.

BRIEF DESCRIPTION OF THE DRAWINGS

The accompanying drawings are used for providing further understanding for technical solutions of the present disclosure and constitute a part of the specification and, together with embodiments of the present disclosure, serve to illustrate the technical solutions of the present disclosure but do not form a limitation on the technical solutions of the present disclosure. A shape and a size of each component in the drawings do not reflect a true scale and only intend to illustrate the contents of the present disclosure.

DETAILED DESCRIPTION OF THE EMBODIMENTS

In order to make objectives, technical solutions and advantages of the embodiments of the present disclosure clearer, the technical solutions of the embodiments of the present disclosure will be described clearly and completely below with reference to the drawings of the embodiments of the present disclosure. Apparently, the described embodiments are some, but not all, embodiments of the present disclosure. Based on the described embodiments of the present disclosure, all other embodiments obtained by those ordinarily skilled in the art without creative work fall within the protection scope of the present disclosure.

Unless otherwise defined, technical or scientific terms used in the present disclosure should be commonly understood by those ordinarily skilled in the art to which the present disclosure belongs. "First", "second" and similar words used in the present disclosure do not represent any sequence, quantity or significance but are only used for distinguishing different components. "Include" or "contain" and other similar words mean that an element or an item preceding the word covers elements or items and their equivalents listed after the word without excluding other elements or items. "Connection" or "connected" and other similar words may include electrical connection, direct or indirect, instead of being limited to physical or mechanical connection. "Above", "below", "left", "right" and the like are only used for representing a relative position relation, and when an absolute position of a described object changes, the relative position relation may also change correspondingly.

In the specification, unless otherwise clearly specified and limited, terms "install", "connection", "connected" should be understood in a broad sense. For example, it may be a fixed connection, or a detachable connection, or an integrated connection; or it may be a mechanical connection, or an electrical connection; or it may be a direct connection, or an indirect connection through middleware, or an internal communication of two elements. Those ordinarily skilled in the art can understand specific meanings of the above terms in the present disclosure according to specific conditions.

Figure 1A:
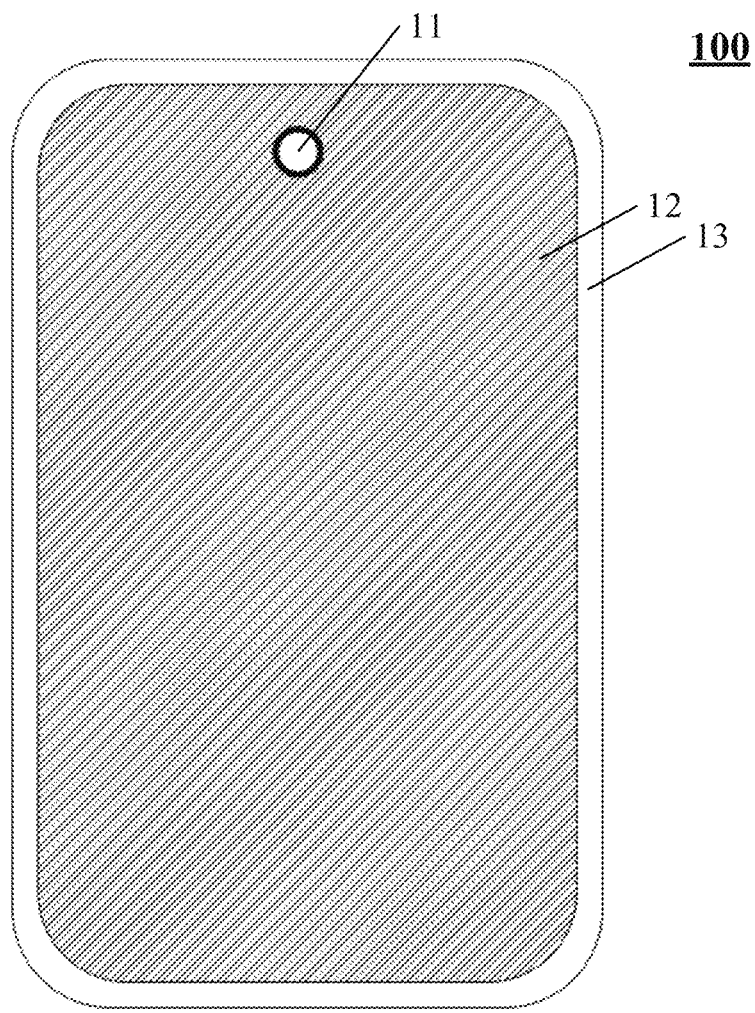
FIG. 1A is a schematic plan view of a display substrate.

In order to realize maximization of a display region of a display apparatus, a camera apparatus (an imaging apparatus) of the display apparatus may be integrated with the display region, the camera apparatus is arranged in the display region, and a position may be reserved in the display region for the camera apparatus by punching a hole. For example, FIG. 1A shows a schematic plan view of a display substrate for a display apparatus. The display substrate 10 includes a display region 12. The display region 12 includes a pixel array and a through hole 11 in the pixel array. The through hole 11 is a reserved position for a camera apparatus (not shown). The camera apparatus may be arranged on a side, facing away from a display surface of the display substrate, of the through hole 11, so that the camera apparatus may capture an image through the through hole 11. Accordingly, the camera apparatus is integrated with the display region 12 of the display substrate 10.

The display region 12 has light-emitting devices for displaying, for example, the light-emitting device is an organic light-emitting diode (OLED). An organic material layer and a drive structure layer in a plurality of light-emitting devices in the whole or a part of the display region 12 are usually formed as a whole surface in the display region 12, so during encapsulation by using an encapsulation layer, a region nearby the through hole 11 is usually hardly encapsulated, or an encapsulation effect of the region is difficult to guarantee even if the region is encapsulated. Besides, due to fluctuation of a cutting process of the through hole, a laser thermal effect, handling and the like, a part of display substrates crack during production, and failure in encapsulation is caused. At the moment, for example, water, oxygen and other impurities may enter the display region 12 from the through hole 11 and contaminate functional layers in the display region 12, which results in degraded performance of these functional layers, and then affects a display effect of the display region 12.

On the one hand, the encapsulation effect nearby the through hole 11 need to be improved; and on the other hand, these display panels of which encapsulation fails need to be screened in a production stage, so as to avoid flowing to a subsequent process and causing a waste, or flowing to a client and causing an unfavorable influence on a product.

In the related art, a panel crack detection (PCD) technology has been widely applied to crack detection of a display panel. In a crack detection technology, a crack detection line is usually arranged in a peripheral region 13 of the display region 12, and the peripheral region surrounds the display region 12. The crack detection technology usually uses change of a resistance value of a metal detection line (the change of the resistance value is caused by cracking or even breaking of the metal detection line) to realize crack detection of the peripheral region of the display panel. A drive structure layer of a through hole region is complicated, if a crack detection line is arranged in the through hole 11, process cost and fabrication difficulty may be increased, yield is decreased, arrangement of the crack detection line may occupy a certain display area, and an area of the display region is reduced, so no crack detection line is arranged in the region of the through hole 11 in the related art.

At least one embodiment of the present disclosure provides a display substrate. The display substrate includes: a base substrate, where the base substrate includes a display region, a peripheral region and a barrier region, the peripheral region surrounds the display region, and the display region surrounds the barrier region; a through hole, located in the barrier region, where a center of the display substrate does not coincide with a center of the through hole; a plurality of sub-pixels, located in the display region; a plurality of signal lines, located in the display region, the peripheral region and the barrier region and electrically connected to the plurality of sub-pixels, where the plurality of signal lines include a first signal line; a shift register circuit, located in the peripheral region and electrically connected to the plurality of signal lines; and at least one circle of crack detection lines, located in the barrier region and surrounding the through hole, where the at least one circle of crack detection line is electrically connected to the first signal line, and the first signal line is electrically connected to at least one sub-pixel in the plurality of sub-pixels.

The display substrate adopts at least a part of an organic functional layer and a drive structure layer of the display region 12 to form a height difference so as to form the barrier region, so that the organic functional layer is isolated from the through hole, and impurities such as water and oxygen can be effectively prevented from entering the display region of the display substrate from the through hole. At least a part of the drive structure layer of the barrier region is multiplexed as the crack detection line, so an area of a non-display region is not increased due to arrangement of the crack detection line, and maximization of the display region of the display substrate is guaranteed. Crack detection of the through hole is realized through electrical connection of the shift register circuit, the first signal line and the at least one circle of crack detection lines in the barrier region.

The display substrate and a fabrication method thereof of some embodiments of the present disclosure are described below through several specific embodiments.

Figure 1B:
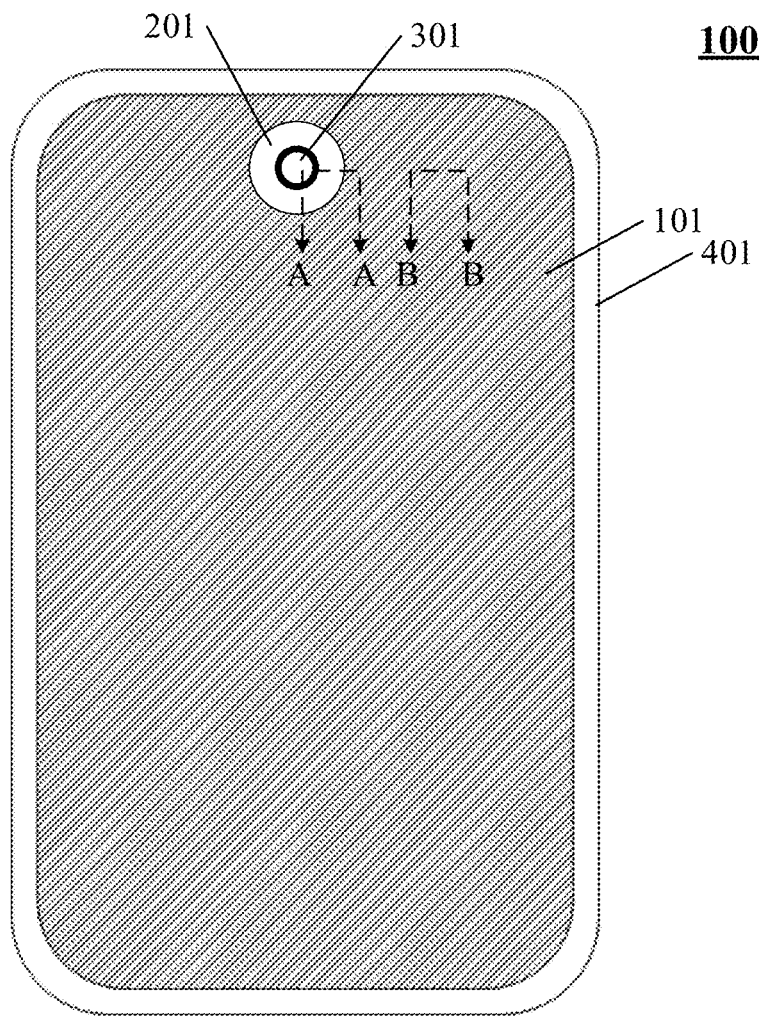
FIG. 1B is a schematic plan view of a display substrate.

FIG. 1B shows a schematic plan view of a display substrate 100. The display substrate 100 includes a display region 101, a peripheral region 401, a barrier region 201 and a through hole 301. A center of the display substrate does not coincide with a center of the through hole. The through hole 301 allows light from a display side of the display substrate 100 to be transmitted through the display substrate 100 so as to reach a back side of the display substrate 100. The display region 101 and the barrier region 201 surround the through hole 301, and the barrier region 201 is located between the display region 101 and the through hole 301.

In an exemplary implementation, the display substrate includes the display region, a bonding region located on a side of the display region and the peripheral region located on other sides of the display region. The display region includes a plurality of sub-pixels distributed regularly. Each of the sub-pixels is connected to at least one gate line and at least one data line (the gate line and the data line are generally called drive signal lines). A drive circuit is arranged in the bonding region and a peripheral region, and the drive circuit is configured to provide a display signal for the display region. In an exemplary implementation, the drive circuit may include: a shift register circuit (gate driver on array, GOA for short), arranged on two sides of the display region and configured to provide a scanning signal for the display region; and a source drive circuit (driver integrated circuit (IC)) arranged in the bonding region and configured to provide a data signal (Data) for the display region. The shift register circuit is composed of a plurality of stages (a cascade connection relation is represented by n in the drawings of the specification, n>=2, and n is a natural number) of shift register units in cascade connection. The shift register circuit includes a gate shift register drive circuit (Gate GOA) and a light-emitting control shift register circuit (EM GOA). In the related art, the gate shift register drive circuit outputs two types of signals: a reset signal (Reset) and a gate scanning signal (Gate). When a pixel circuit receives a low-potential pulse of the reset signal, at least one row of sub-pixels of the display region 12 are initialized, and a new data signal is written under action of the subsequent gate scanning signal. The light-emitting control shift register circuit outputs a light-emitting control signal (EM). The light-emitting control signal forbids the sub-pixels from emitting light during initialization and data signal writing, after the data signal is accurately read, the sub-pixels are started to emit light, and light-emitting time is controlled.

Figure 2A:
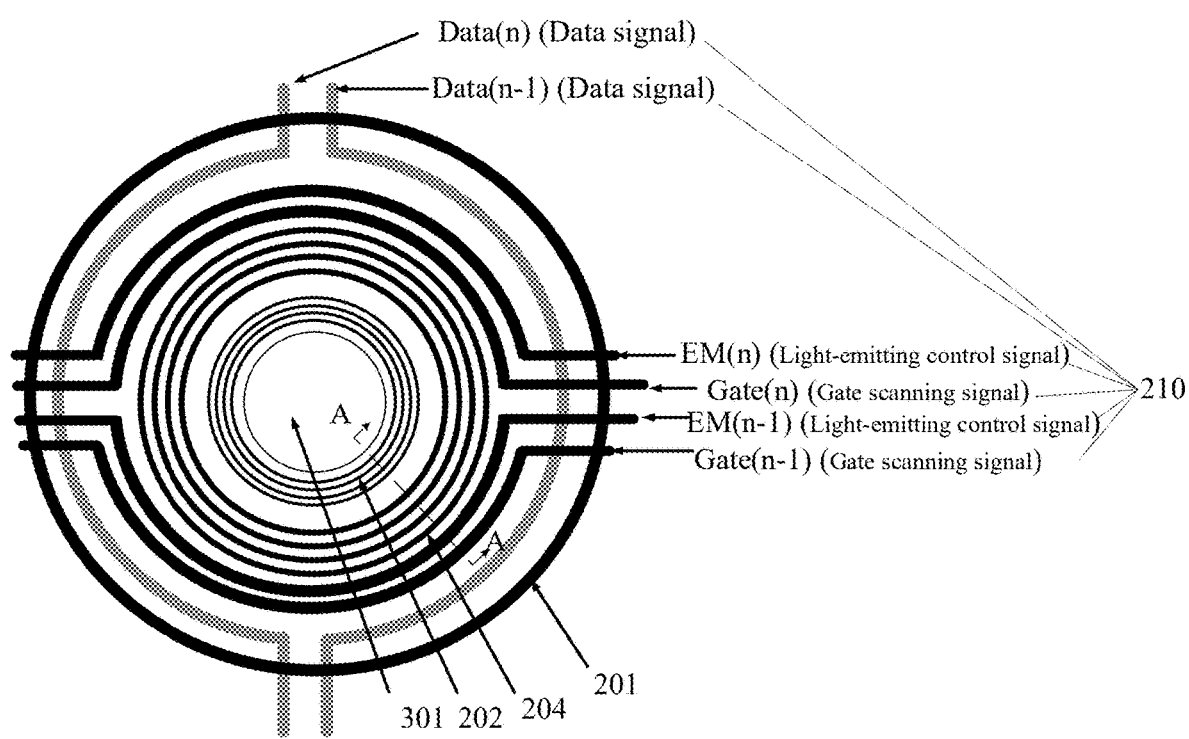
FIG. 2A is a schematic enlargement view of a barrier region 201 of a display substrate in FIG. 1B.

As shown in FIG. 2A, FIG. 2A is a schematic partial enlargement view of a barrier region 201 in FIG. 1B. The barrier region 201 includes a plurality of signal lines 210; the plurality of signal lines 210 are electrically connected to drive signal lines (not shown in the figure) of the display region 101; and the plurality of signal lines 210 are located on a side, close to the display region 101, of the barrier wall 202. The plurality of signal lines may transmit the same signal or transmit at least a part of different signals. For example, when the plurality of signal lines transmit different signals, the plurality of signal lines may include a gate scanning signal line, a light-emitting control signal line and a data signal line, etc. The plurality of signal lines in the barrier region are electrically connected to the drive signal lines in the display region 101 in a one-to-one correspondence mode, and thus wire winding of the through hole 301 is realized.

Figure 2B:
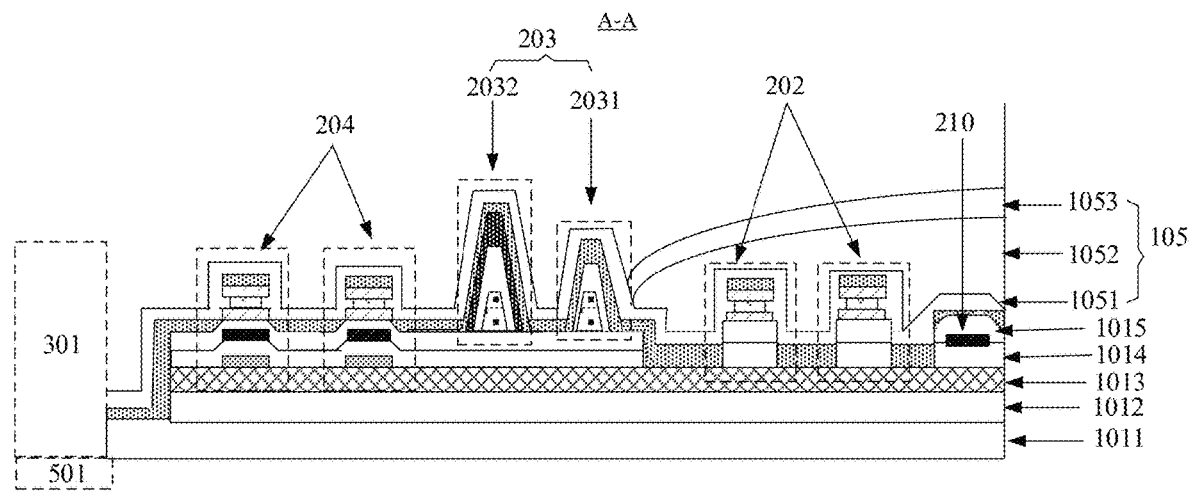
FIG. 2B is a schematic cross-sectional view of a display substrate along a line A-A in FIG. 1B and FIG. 2A.

As shown in FIG. 2B, the barrier region 201 further includes a barrier wall 202, a intercept wall 203 and a crack blocking wall 204 arranged in sequence in a direction (namely, a direction from right to left in FIG. 2B) from the display region 101 to the through hole 301. The barrier wall 202, the intercept wall 203 and the crack blocking wall 204 all surround the through hole 301. The barrier region 201 may isolate the display region 101 from the through hole 301 so as to realize an effect on protecting the display region 101. For clear showing, the intercept wall 203 is not shown in FIG. 2A, the intercept wall 203 is located between the barrier wall 202 and the crack blocking wall 204. For example, the quantity of barrier walls 202, intercept walls 203 and crack blocking walls 204 each may be one or more, and FIG. 2B shows two barrier walls 202, one intercept wall 203 and two crack blocking walls 204 as an example, which does not constitute a limitation on the embodiments of the present disclosure.

Figure 2C:
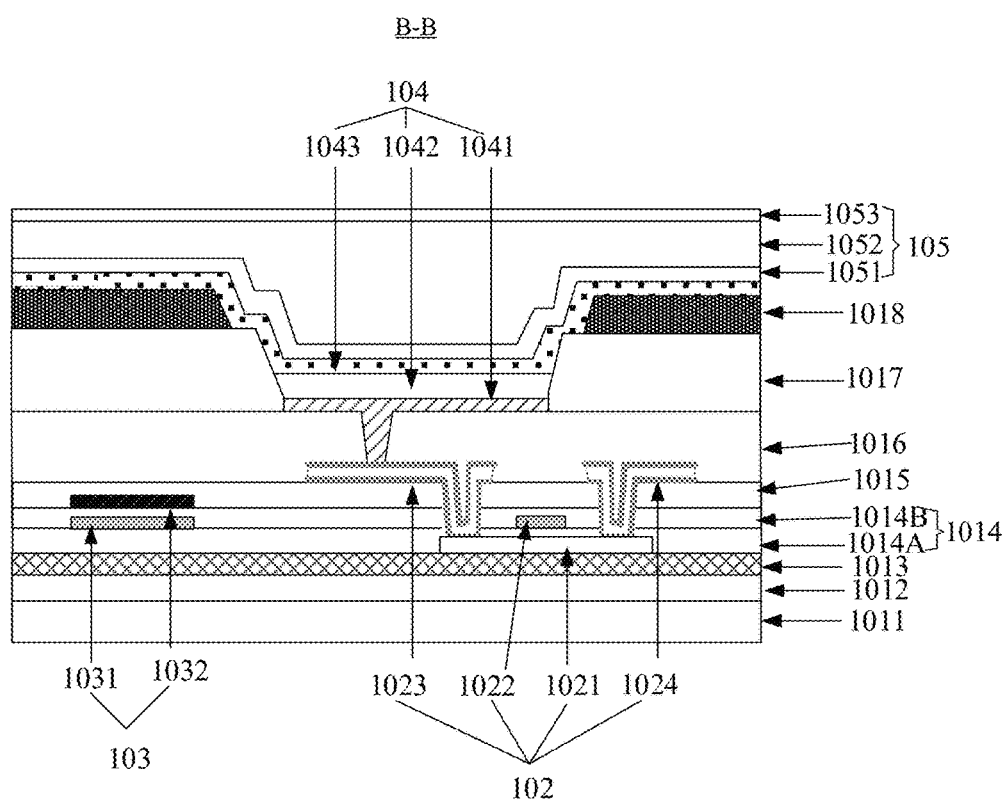
FIG. 2C is a schematic cross-sectional view of a display substrate along a line B-B in FIG. 1B.

In an exemplary implementation, as shown in FIG. 2B and FIG. 2C, the display substrate 100 includes the base substrate 1011. In some examples, the display substrate 100 may be a flexible display substrate, and at the moment, the base substrate 1011 may be made of a flexible insulation material such as polyimide (PI). In some other examples, the base substrate 1011 may also be a rigid display substrate made of glass.

The display substrate 100 may further include a blocking layer 1012 and a buffer layer 1013 arranged on the base substrate 1011. The blocking layer 1012 may prevent water, oxygen and other impurities from infiltrating into a functional structure such as a thin-film transistor 102 from the base substrate 1011, and the buffer layer 1013 may provide a flat surface, so as to conveniently arrange other functional layers of the display substrate. The blocking layer 1012 and the buffer layer 1013 may jointly play a role in protecting other functional structures on the base substrate 1011.

In an exemplary implementation, as shown in FIG. 2C, the drive structure layer of the display substrate 100 includes the thin-film transistor 102, a storage capacitor 103 and other structures. The thin-film transistor 102 includes an active layer 1021, a gate 1022, a first insulation layer 1014 (for example, including a first insulation sub-layer 1014A and a first insulation sub-layer 1014B), a second insulation layer 1015 and source-drain electrodes (including a source 1024 and a drain 1023) arranged on the base substrate 1011 in sequence. For example, the source-drain electrodes have a three-layer metal layer structure, for example, a three-layer metal layer structure of titanium/aluminum/titanium, molybdenum/aluminum/molybdenum, or titanium/copper/titanium molybdenum/copper/molybdenum, etc. The storage capacitor 103 includes a first polar plate 1031 and a second polar plate 1032. For example, the first polar plate 1031 and the gate 1022 are arranged on the same layer, and the second polar plate 1032 is arranged between the first insulation layer 1014 and the second insulation layer 1015.

For example, in some embodiments, the plurality of signal lines 210 in the barrier region are at least partially arranged on the same layer as the second polar plate 1032, the first polar plate 1031 and the source-drain electrodes 1023/1024.

In the embodiment of the present disclosure, two or more functional layers being arranged on the same layer means that these functional layers arranged on the same layer may be formed by using the same material layer and using the same fabrication process (for example, a patterning process, etc.), so as to simplify a fabrication process of the display substrate. Therefore, these functional layers arranged on the same layer may adopt the same material layer and be formed by the same patterning process so as to simplify the fabrication process of the display substrate.

In an exemplary implementation, the display region 101 of the display substrate 100 further includes a planarization layer 1016, a pixel defining layer 1017 and a spacer 1018. The planarization layer 1016 is configured to planarize the thin-film transistor 102; the pixel defining layer 1017 is located on a side, away from the thin-film transistor 102, of the planarization layer 1016; and the pixel defining layer 1017 is configured to define the plurality of sub-pixels. The spacer 1018 is located on a side, away from the planarization layer 1016, of the pixel defining layer 1017.

In an exemplary implementation, the display region 101 includes the plurality of sub-pixels. The sub-pixels include a drive structure layer and light-emitting devices 104. The drive structure layer includes a plurality of drive signal lines, and the drive signal lines drive the light-emitting devices 104 to emit light. The light-emitting device 104 may be, for example, an OLED or a quantum dot light-emitting diode (QLED).

In some embodiments, the light-emitting device 104 includes an anode layer 1041, an organic functional layer 1042 and a cathode layer 1043. The organic functional layer 1042 is located between the anode layer 1041 and the cathode layer 1043. The anode layer 1041 is connected to the drain 1023 of the thin-film transistor through a via hole in the planarization layer 1016. The organic functional layer 1042 may further include an auxiliary light-emitting layer (not shown in the figure), for example, including one or more among an electron transport layer, an electron injection layer, a hole transport layer and a hole injection layer. The auxiliary light-emitting layer is, for example, an organic material layer. For example, the organic functional layer 1042 may also be formed on a whole surface of the base substrate 1011 and is disconnected at the barrier wall 202 and the crack blocking wall 204. For example, the cathode layer 1043 is formed on a whole surface of the base substrate 1011 and is disconnected at the barrier wall 202 and the crack blocking wall 204. For example, a part of the organic functional layer 1042 and a part of the cathode layer 1043 are also formed on a top of the barrier wall 202 and on a top of the crack blocking wall 204, but these parts are separated from other parts.

Figure 3A:
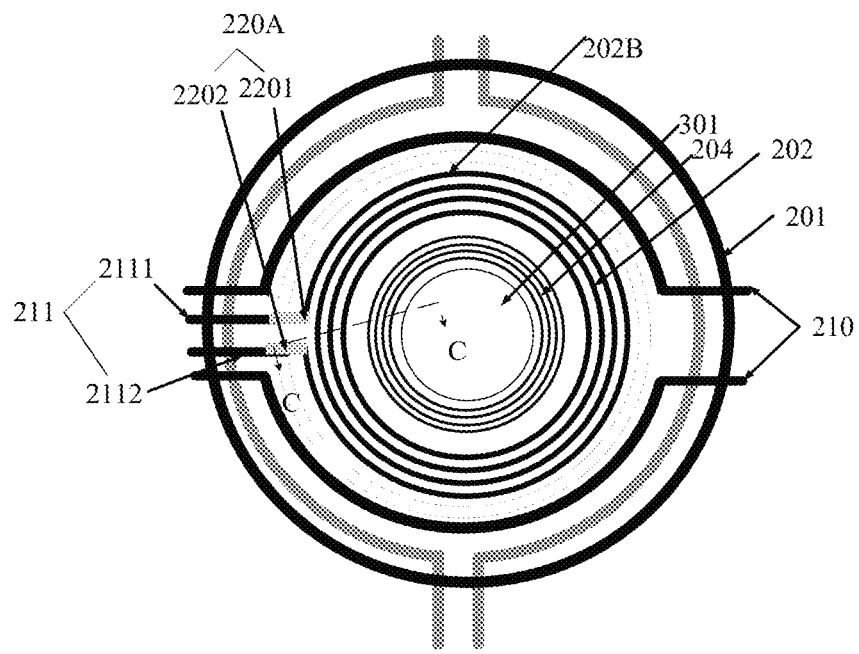
FIG. 3A is a schematic enlargement view of a barrier region 201 of a display substrate in FIG. 1B provided by at least one embodiment of the present disclosure.
Figure 3B:
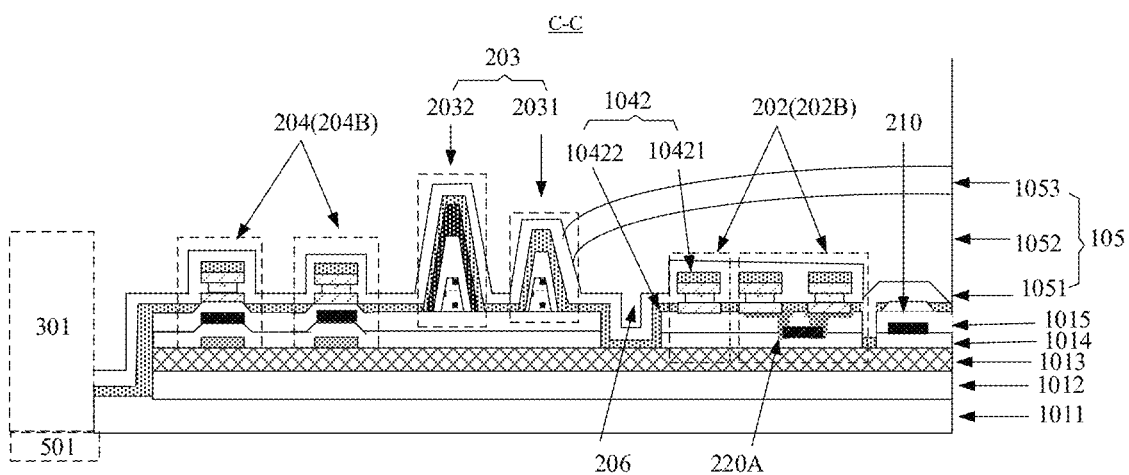
FIG. 3B is a schematic cross-sectional view of a display substrate along a line C-C in FIG. 3A.

For example, in an exemplary embodiment of the present disclosure, as shown in FIG. 3B, the barrier region 201 includes a first organic functional layer 10421 and a second organic functional layer 10422 arranged on the same layers and having the same material as the organic functional layer 1042. The first organic functional layer 10421 is located on a side, away from the base substrate, of the at least one circle of crack detection lines; and the second organic functional layer is located on a side, away from the base substrate, of the first multi-layer insulation layer 202A. The first organic functional layer 10421 and the second organic functional layer 10422 are arranged intermittently, and an orthographic projection of the first organic functional layer 10421 on the base substrate does not overlap with an orthographic projection of the second organic functional layer 10422 on the base substrate.

Therefore, when the organic functional layer located on a side close to the through hole 301 is contaminated by impurities such as water and oxygen, since the organic functional layer is disconnected by the barrier wall 202 and the crack blocking wall 204, so that these contaminating impurities cannot extend into a part of the organic functional layer used for making the light-emitting device emit light.

For example, in an exemplary embodiment of the present disclosure, as shown in FIG. 3A and FIG. 3B, the barrier region further includes at least one circle of crack detection lines 202B which is arranged surrounding the through hole. The crack detection line 202B forms at least a part of the barrier wall 202, namely, at least a part of a first barrier wall 202 is multiplexed as the crack detection line 202B. For example, the crack detection line 202B and the source-drain electrodes 1023/1024 are arranged on the same layer. The drive structure layer of the display substrate includes the source-drain electrodes 1023/1024, that is, at least a part of the drive structure layer of the display substrate is multiplexed as the at least one circle of crack detection lines 202B.

For example, as shown in FIG. 3A, the crack detection line 202B is arranged on the barrier wall on a side close to the display region. In some other embodiments, the barrier region 201 contains a plurality of barrier walls 202, and the at least one circle of crack detection lines 202B are arranged on any one circle of barrier wall.

Figure 7A:
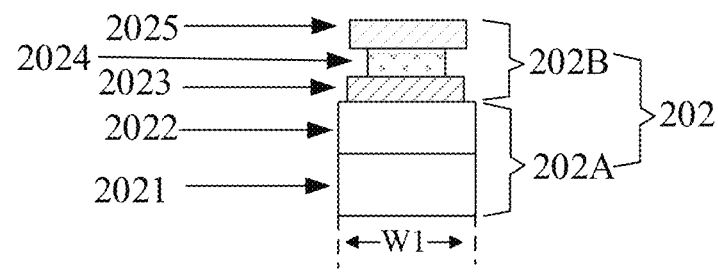
FIG. 7A is a schematic cross-sectional view of a barrier wall in a display substrate provided by at least one embodiment of the present disclosure.

For example, the at least one circle of crack detection lines 202B have a three-layer metal layer structure, example, a three-layer metal layer structure of titanium/aluminum/titanium, molybdenum/aluminum/molybdenum, titanium/copper/titanium or molybdenum/copper/molybdenum, etc. For example, as shown in FIG. 7A, which shows a schematic cross-sectional view of a barrier wall 202, and the at least one circle of crack detection lines 202B include a first sub-layer 2025, a second sub-layer 2024 and a third sub-layer 2023 sequentially located on a side, away from the base substrate, of the first multi-layer insulation layer 202A. An orthographic projection of the second sub-layer 2024 on the base substrate is located in orthographic projections of the first sub-layer 2025 and the third sub-layer 2023 on the base substrate.

For example, in some embodiments, the barrier wall 202 may further include the first multi-layer insulation layer 202A, and the crack detection line 202B is located on the first multi-layer insulation layer 202A. For example, the first multi-layer insulation layer 202A includes a plurality of insulation sub-layers, for example, including insulation sub-layers 2021 and 2022 shown in FIG. 7A. For example, the insulation sub-layer 2021 and the first insulation layer 1014 are arranged on the same layer, and the insulation sub-layer 2022 and the second insulation layer 1015 are arranged on the same layer.

For example, as shown in FIG. 7A, a width W1 of the barrier wall 202 may range from 2 μm to 4 μm, for example, 3 μm or 3.5 μm, etc.

For example, in some examples, the quantity of blocking layers and buffer layers included on the base substrate may be more, and a second part of the first multi-layer insulation layer 202A may be arranged on the same layer as more blocking layers and buffer layers.

Figure 9A:
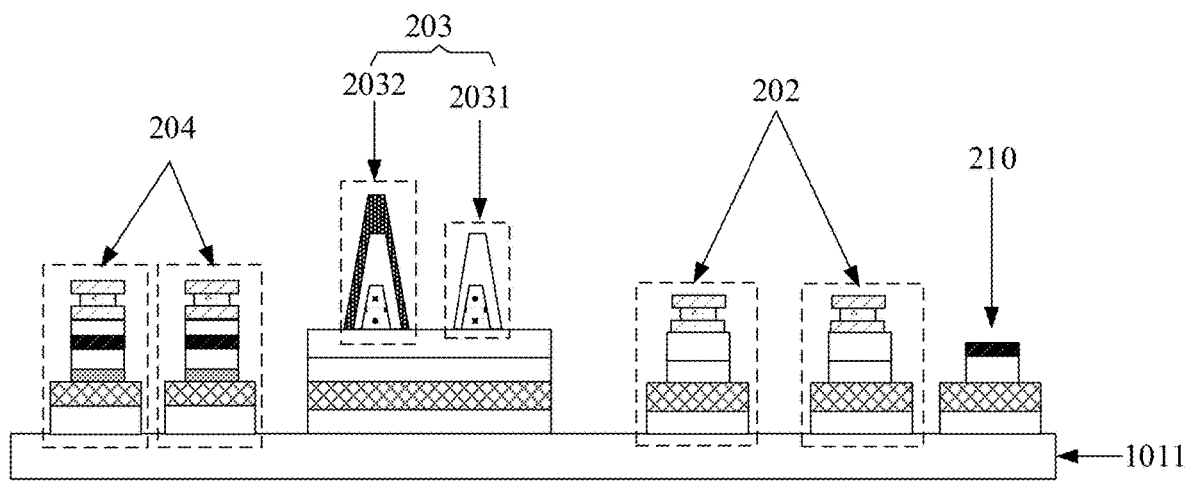
FIG. 9A is a schematic partial cross-sectional view of a display substrate provided by at least one embodiment of the present disclosure.
Figure 9B:
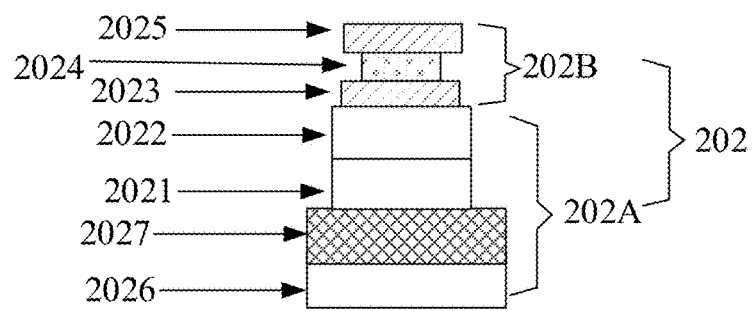
FIG. 9B is another schematic cross-sectional view of a barrier wall in a display substrate provided by at least one embodiment of the present disclosure.

For example, in some examples, as shown in FIG. 9B, the first multi-layer insulation layer 202A of the barrier wall 202 includes a first part (including the insulation sub-layer 2021 and the insulation sub-layer 2022) and the second part (including an insulation sub-layer 2026 and an insulation sub-layer 2027) arranged in stack, the first part is arranged on the same layer at least as the first insulation layer 1014 and the second insulation layer 1015, and the second part is arranged on the same layer at least as the blocking layer 1012 and the buffer layer 1013. Besides, for clear and concise showing, the first insulation layer 1014 in the barrier region 201 is only shown as one layer in the figure.

For example, widths of the first part and the second part of the first multi-layer insulation layer 202A are different, for example, the second part is wider than the first part, so that a whole longitudinal section of the first multi-layer insulation layer 202A is in a stair-step shape, as shown in FIG. 9B.

In some embodiments, the plurality of signal lines 210 include the first signal line 211. The first signal line 211 is one of the plurality of signal lines 210 electrically connected to the crack detection line 202B.

For example, please refer to FIG. 3A again, the at least one circle of crack detection lines 202B include at least one first lap joint structure 220A, which is configured to electrically connect the at least one circle of crack detection lines with the first signal line 211.

For example, as shown in FIG. 3A, the quantity of first lap joint structure 220A is two, namely, 2201 and 2202; and the two first lap joint structures 2201 and 2202 are electrically connected to a first routing sub-wire 2111 of the first signal line and a first end of the at least one circle of crack detection lines 202B as well as a second end of the at least one circle of crack detection lines 202B and a second routing sub-wire 2112 respectively. The first routing sub-wire 2111 and the second routing sub-wire 2112 belong to the first signal line 211. The two first lap joint structures 2201 and 2202 may be located on opposite sides of a radial direction of the through hole 301, or may be located on the same side of the radial direction of the through hole 301, or located on any one side of the radial direction of the through hole 301, which is not limited herein.

For example, the first signal line 211, the first lap joint structure 220A and the second polar plate 1032 are arranged on the same layer. The first lap joint structure 220A is electrically connected to the at least one circle of crack detection lines 202B of the barrier wall through a via hole, and the via hole penetrates through the second insulation layer 1015 so as to expose the first lap joint structure 220A. In some other embodiments, the first signal line 211, the first lap joint structure 220A and the first polar plate 1031 are arranged on the same layer. The first lap joint structure 220A is electrically connected to the at least one circle of crack detection lines 202B through a via hole, and the via hole penetrates through the first insulation layer 1014 and the second insulation layer 1015 so as to expose the first lap joint structure 220A. The first lap joint structure is arranged so as to eliminate an electrostatic cumulative effect on the crack detection line.

For example, in some other embodiments, the first signal line 211, the first lap joint structure 220A and the source-drain electrodes 1023/1024 are arranged on the same layer. At the moment, electrically connection of the first signal line 211, the first lap joint structure 220A and the at least one circle of crack detection lines 202B may be realized without arranging the via hole. In other words, the first lap joint structure 220A may also be not arranged.

For example, in some embodiments, the first lap joint structure 220A may be a plurality of layers, for example, at least a part of the first lap joint structure is arranged on the same layer as the first polar plate 1031 and at least a part of the first lap joint structure is arranged on the same layer as the second polar plate 1032. A plurality of layers of structures of the first lap joint structure 220A are electrically connected to one another and electrically connected to the at least one circle of crack detection lines 202B through the via hole, and the multi-layer first lap joint structure may eliminate the electrostatic cumulative effect on the crack detection line.

For example, in some embodiments, the quantity of circles of crack detection lines 202B is multiple, and the multiple circles of crack detection lines are continuous routing wires and surround the through hole.

Figure 4A:
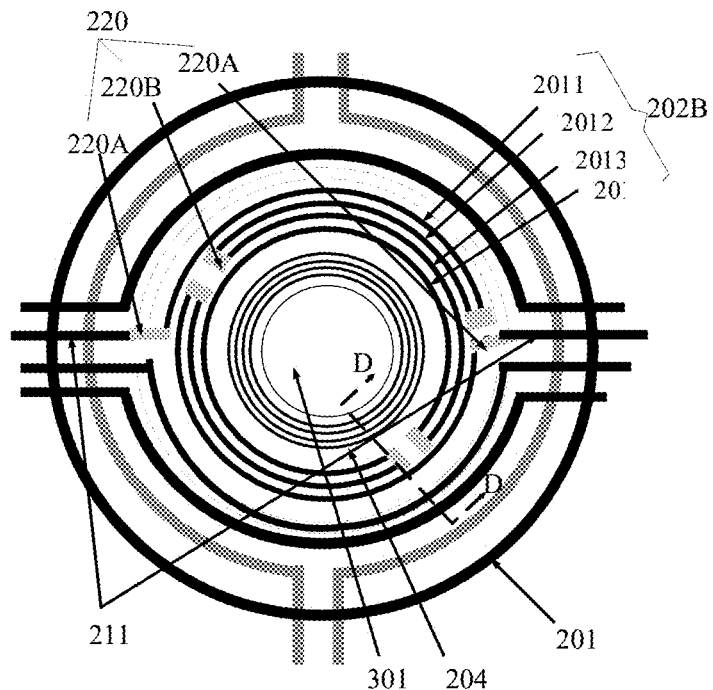
FIG. 4A is a schematic enlargement view of a barrier region 201 of a display substrate in FIG. 1B provided by at least one embodiment of the present disclosure.
Figure 4B:
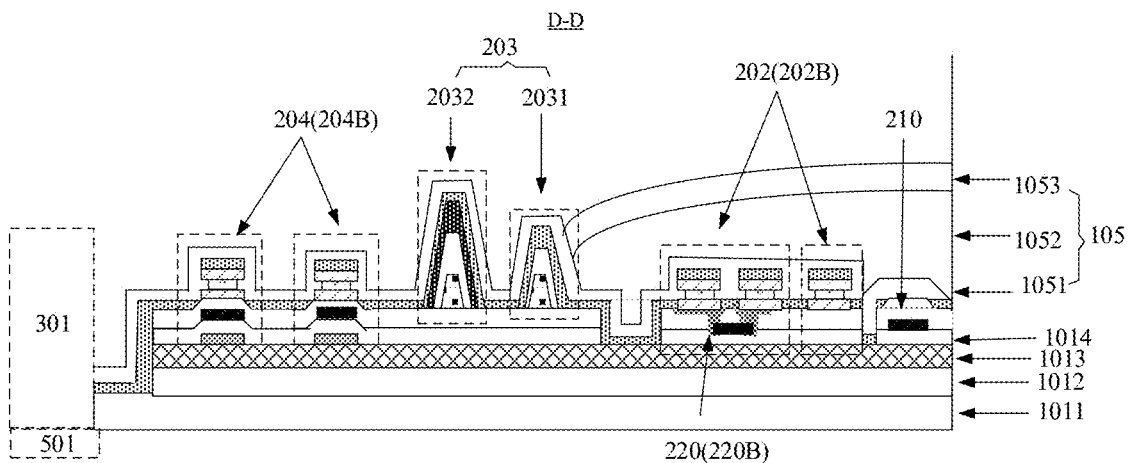
FIG. 4B is a schematic cross-sectional view of a display substrate along a line D-D in FIG. 4A.
Figure 4C:
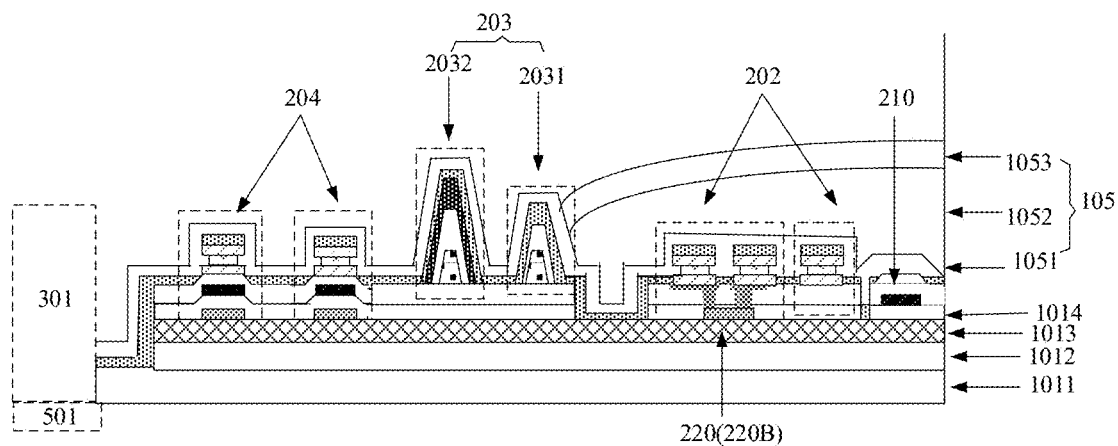
FIG. 4C is a schematic cross-sectional view of a display substrate along a line D-D in FIG. 4A provided by at least one embodiment of the present disclosure.

For example, in an example shown in FIG. 4A, FIG. 4B and FIG. 4C, FIG. 4B is a schematic partial cross-sectional view along a line D-D in FIG. 4A, the at least one circle of crack detection lines 202B include at least one second lap joint structure 220B, the two adjacent circles of crack detection lines are electrically connected to each other through the at least one second lap joint structure 220B, and the at least one second lap joint structure and the two adjacent circles of crack detection lines are located on different layers and electrically connected through a via hole.

For example, in the example shown in FIG. 4A, FIG. 4B and FIG. 4C, the quantity of circles of crack detection lines 202B is four; and the crack detection lines respectively include a first detection routing sub-wire 2011, a second detection routing sub-wire 2012, a third detection routing sub-wire 2013 and a fourth detection routing sub-wire 2014 in a radial direction approaching the center of the through hole 301. The first detection routing sub-wire 2011 is electrically connected to the second detection routing sub-wire 2012 through the at least one second lap joint structure 220B through a via hole; and any two of the second detection routing sub-wire 2012, the third detection routing sub-wire 2013 and the fourth detection routing sub-wire 2014 are electrically connected to each other through the at least two second lap joint structures 220B through a via hole. Therefore, it can be realized that the plurality of circles of crack detection lines 202B surround the through hole 301, and the plurality of circles of crack detection lines 202B are connected into a continuous and non-broken annular metal wire through the plurality of second lap joint structures 220B. The plurality of second lap joint structures 220B may be distributed at intervals in the radial direction of the through hole 301, the quantity and a distribution position of the plurality of second lap joint structures 220B are not limited here, but in order to realize that the barrier wall and the crack blocking wall 204 jointly achieve a double blocking effect, the plurality of second lap joint structures 220B are distributed in the radial direction of the through hole 301 without overlapping. Similarly, the plurality of second lap joint structures are arranged so as to eliminate the electrostatic cumulative effect on the crack detection lines.

For example, a lap joint structure 220 may be arranged on the same layer as the second polar plate, as shown in FIG. 4B; or a lap joint structure 220 may also be arranged on the same layer as the first polar plate, as shown in FIG. 4C; or a part of the lap joint structure is arranged on the same layer as the first polar plate, and a part of the lap joint structure is arranged on the same layer as the second polar plate, which is not shown in the figure. In some other embodiments, the second lap joint structure 220B may be a plurality of layers, for example, at least a part of the second lap joint structure is on the same layer as the first polar plate 1031 and at least a part of the second lap joint structure is on the same layer as the second polar plate 1032, and a plurality of layers of structures of the second lap joint structure 220B are electrically connected to one another and electrically connected to the at least one circle of crack detection lines 202B through a via hole.

Both the first lap joint structure 220A and the second lap joint structure 220B belong to the lap joint structure 220, which may be formed by using the same material layer and the same patterning process so as to simplify the fabrication process of the display substrate.

Figure 5:
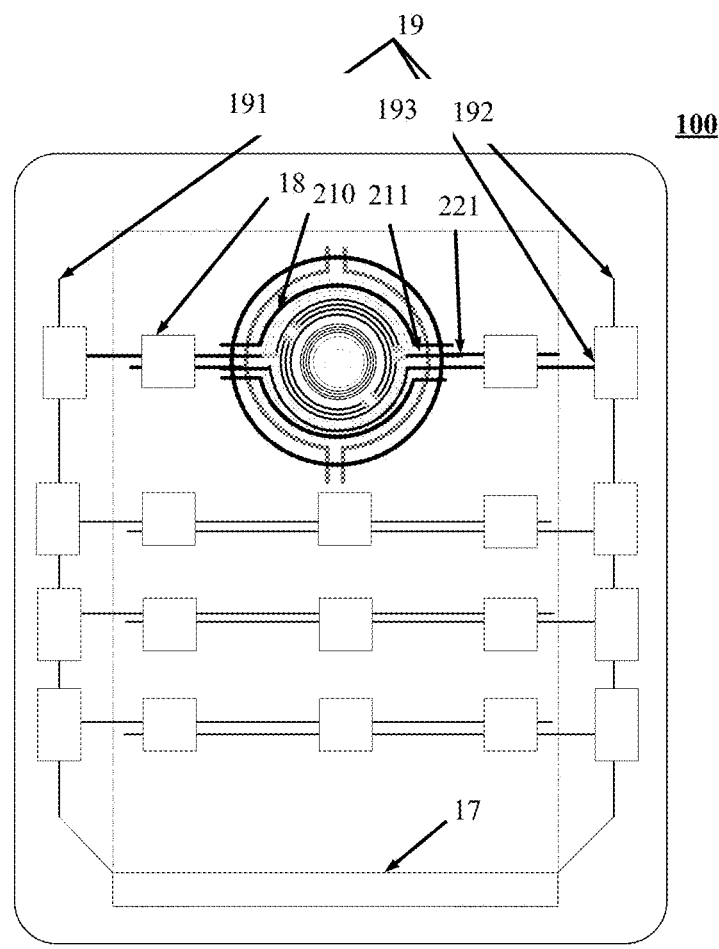
FIG. 5 is a schematic diagram of a connection mode of a crack detection line of a display substrate provided by at least one embodiment of the present disclosure.

For example, in some embodiments, as shown in FIG. 5, the display substrate 100 includes the shift register circuit 19 located in the peripheral region and electrically connected to the plurality of signal lines 210. The shift register circuit 19 includes the plurality of cascaded shift register units 193. The shift register circuit 19 may include a gate shift register circuit 191 (Gate GOA), or a light-emitting control shift register circuit 192 (EM GOA). The gate shift register circuit 191 includes a plurality of cascaded shift register units 193, and the light-emitting control shift register circuit 192 includes a plurality of cascaded shift register units 193. Arrangement of the gate shift register circuit 191 and the light-emitting control shift register circuit 192 in the figure are only as an example. As shown in FIG. 5, the gate shift register circuit 191 and the light-emitting control shift register circuit 192 are arranged on opposite sides of the display substrate 100. Certainly, there may be different arrangement modes of shift register circuits of an actual substrate, which is not limited herein.

For example, the drive structure layer of the display substrate 100 contains the shift register circuit 19, the shift register circuit 19 is electrically connected to the plurality of sub-pixels 18 of the display region and drive the plurality of sub-pixels 18 row by row to realize displaying. The display substrate 100 further includes the bonding region 17 located on at least one side of the display panel. The bonding region 17 is electrically connected to the shift register circuit 19. At least one of the plurality of drive signal lines 221 is electrically connected to the first signal line 211. At least one of drive signal lines electrically connected to the first signal line 211 is electrically connected to at least one of the plurality of sub-pixels 18. In other words, the first signal line 211 is electrically connected to at least one of the sub-pixels 18.

For example, the first signal line 211 is electrically connected to one shift register unit of the plurality of gate shift register circuits 191, so the drive signal line electrically connected to the first signal line 211 is one of gate scanning signal lines. For example, the first signal line 211 is electrically connected to one shift register unit of the plurality of light-emitting control shift register circuits 192, so the drive signal line electrically connected to the first signal line 211 is one of light-emitting control signal lines.

In an exemplary embodiment, if the through hole 301 has a crack, and the at least one circle of crack detection lines 202B of the barrier wall 202 have a crack (or disconnection), then a resistance value of the at least one circle of crack detection lines 202B is increased. Therefore, a resistance value of a row where the first signal line 211 electrically connected to the crack detection line is located is increased, a resistance value of a row where at least one sub-pixel electrically connected thereto is located changes (for example, increases), so light-emitting brightness of the light-emitting device 104 of the sub-pixel 18 driven by the drive structure layer changes, that is, displaying is abnormal, and thus crack detection of the through hole 301 is realized.

In the display substrate provided by the embodiments of the present disclosure, the at least a part of the drive structure layer in the barrier region is multiplexed as the crack detection line, so an area of a non-display region is not increased due to arrangement of the crack detection line, and maximization of the display region of the display substrate is guaranteed. Crack detection of the through hole is realized through electrical connection of the shift register circuit, the first signal line and the at least one circle of crack detection lines in the barrier region, and reliability of the display substrate is improved.

Figure 6:
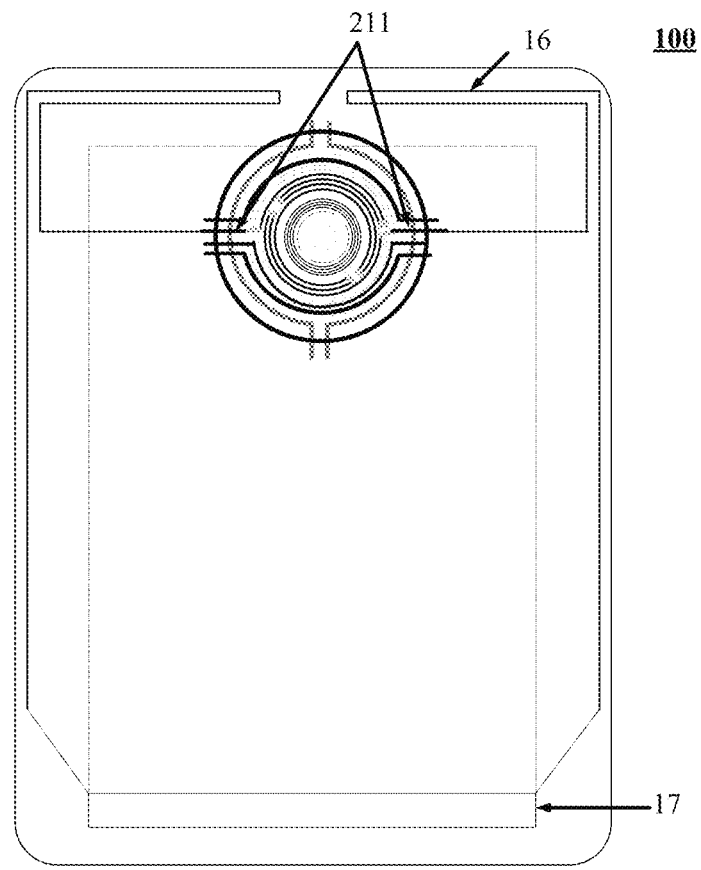
FIG. 6 is a schematic diagram of a connection mode of a crack detection line of a display substrate provided by at least one embodiment of the present disclosure.

For example, in some embodiments, as shown in FIG. 6, the display substrate 100 includes the crack detection line 16 located in the peripheral region. The crack detection line 16 realizes crack detection of the peripheral region of the display substrate. The crack detection line is in lap joint with the bonding region 17, and crack detection of the display substrate 100 is realized through a signal control structure in the bonding region.

In an exemplary embodiment, during crack detection, a detection signal is applied to one end of the crack detection line 16 through the signal control structure of the bonding region, the signal is received through another end of the crack detection line 16 located in the bonding region, and whether the display panel has a crack may be judged according to a state of the received signal. The crack detection line is a whole loop, and when any position of the peripheral region of the display panel has a crack, occurrence of the crack may be judged according to the received signal exceeding a preset range. In some embodiments, the resistance value of the crack detection line gets larger (or exceeding a preset range value) due to a crack (or breaking) of a part of the through hole 301, so it's judged that the crack occurs according to a received signal end located in the bonding region, and crack detection is realized.

In the display substrate provided by the embodiment of the present disclosure, crack detection of the through hole 301 can be realized by using the crack detection line 16 of the display substrate, and reliability of the display substrate is improved.

In an exemplary embodiment, please refer to FIG. 3B and FIG. 7A again, the barrier wall 202 includes at least one circle of crack detection lines 202B; and at least one side surface, surrounding the through hole 301, of the at least one circle of crack detection lines 202B has a notch. In another exemplary embodiment, a side surface, facing the through hole 301, of the at least one circle of crack detection lines 202B and a side surface, facing away from the through hole 301, of the at least one circle of crack detection lines 202B both have notches. The barrier wall 202 may disconnect the functional layers formed on a whole surface of the display substrate, for example, the organic functional layer 1042 and the cathode layer 1043, etc. of the light-emitting device.

In an exemplary embodiment, please refer to FIG. 3B again, the barrier region further includes at least one groove 206, the groove 206 is located between the intercept wall 203 and the barrier wall 202 and penetrates through the first insulation layer 1014 and at least a part of the second insulation layer 1015, and an orthographic projection of the groove on the base substrate does not overlap with an orthographic projection of the at least one circle of crack detection lines on the base substrate. The groove 206 may be generated through a patterning process together with the first insulation layer and/or the second insulation layer while the first insulation layer 1014 and the second insulation layer 1015 are generated, or may also be regenerated through processes such as exposure, developing and etching after the first insulation layer 1014 and the second insulation layer 1015 are generated. The quantity of the groove may be one, that is, the groove is located between the intercept wall 203 and the barrier wall 202. In some other embodiments, the quantity of grooves may be more, for example, the grooves are located among the plurality of barrier walls. The quantity and a position of the grooves do not constitute limitation on the present disclosure. Certainly, in some other embodiments, the groove may also be not arranged. Arrangement of the first multi-layer insulation layer 202A and the at least one groove 206 may enhance a barrier effect of the barrier wall 202, and facilitates subsequent better formation of a first inorganic encapsulation layer 1051 (introduced later), formed on the barrier wall 202 by, for example, deposition and other modes, along a surface morphology of the barrier wall 202.

In an exemplary embodiment, please refer to FIG. 3B again, the barrier region 201 includes the barrier wall 202, the intercept wall 203 and the crack blocking wall 204 sequentially arranged in a direction from the display region 101 to the through hole 301 (namely, a direction from right to left in FIG. 3B); and the barrier wall 202, the first intercept wall 203 and the crack blocking wall 204 all surround the through hole 301. There are at least one circle of intercept walls 203 and the at least one circle of intercept walls 203 is arranged surrounding the through hole. The at least one circle of intercept wall 203 is configured to block an organic encapsulation layer for encapsulating a plurality of sub-pixels.

Figure 7B:
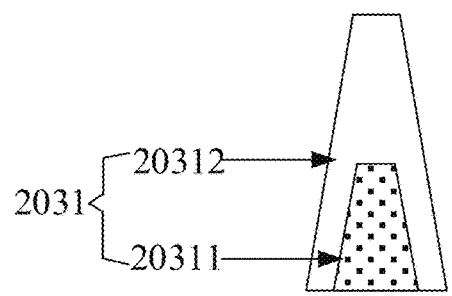
FIG. 7B is a schematic cross-sectional view of a first intercept wall in a display substrate provided by at least one embodiment of the present disclosure.

For example, as shown in FIG. 7B, the intercept wall 203 includes the second multi-layer insulation layer; and the second multi-layer insulation layer includes, for example, laminations of a plurality of insulation sub-layers, for example, including laminations of the two insulation sub-layers 20311 and 20312. The intercept wall 203 may intercept some functional layers (for example, the organic encapsulation layer) formed in the display region 101, so that materials of these functional layers are prevented from approaching or entering the through hole 301. The intercept wall 203 is configured to block the material of the organic encapsulation layer for encapsulating the plurality of sub-pixels.

For example, the insulation sub-layers 20311 and 20312 are in one-to-one correspondence with and are arranged on the same layers as two of the planarization layer 1016, the pixel defining layer 1017 and the spacer 1018. For example, the second multi-layer insulation layer of the intercept wall 203 is arranged on the same layer as at least one of the planarization layer 1016, the pixel defining layer 1017 and the spacer 1018. For example, the insulation sub-layer 20311 is arranged on the same layer as the planarization layer 1016, and the insulation sub-layer 20312 is arranged on the same layer as the pixel defining layer 1017; or the insulation sub-layer 20311 is arranged on the same layer as the planarization layer 1016, and the insulation sub-layer 20312 is arranged on the same layer as the spacer 1018; or the insulation sub-layer 20311 is arranged on the same layer as the pixel defining layer 1017, and the insulation sub-layer 20312 is arranged on the same layer as the spacer 1018. Therefore, these functional layers arranged on the same layer may adopt the same material layer and be formed by the same patterning process in the fabrication process.

Figure 7C:
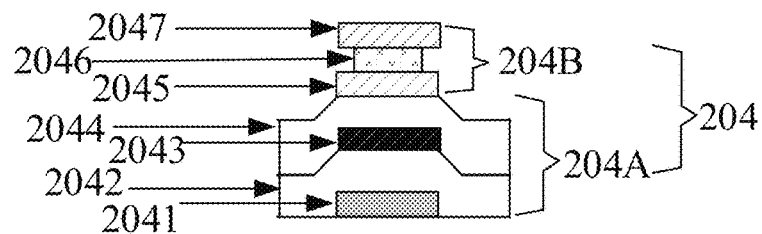
FIG. 7C is a schematic cross-sectional view of a crack blocking wall in a display substrate provided by at least one embodiment of the present disclosure.
Figure 7D:
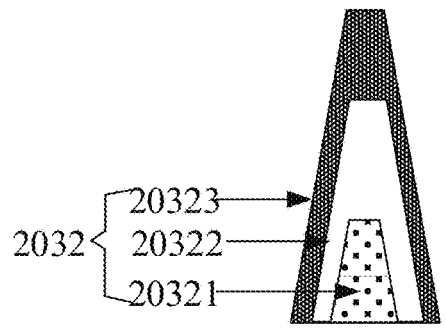
FIG. 7D is a schematic cross-sectional view of a second intercept wall in a display substrate provided by at least one embodiment of the present disclosure.

For example, in some embodiments, as shown in FIG. 3B and FIG. 7D, the at least one circle of intercept walls includes the first intercept wall 2031 and the second intercept wall 2032. The second intercept wall 2032 is adjacent to the first intercept wall 2031 and located on a side, away from the display region 101, of the first intercept wall 2031; and the largest height of the first intercept wall 2031 in a direction perpendicular to the base substrate is smaller than the largest height of the second intercept wall 2032 in the direction perpendicular to the base substrate. Therefore, the second intercept wall 2032 and the first intercept wall 2031 can jointly achieve a double intercept effect.

For example, in some examples, as shown in FIG. 7D, the second intercept wall 2032 includes a plurality of insulation sub-layers, including the insulation sub-layers 20321, 20322 and 20323 shown in FIG. 7D. For example, the insulation sub-layer 20321 is arranged on the same layer as the planarization layer 1016, the insulation sub-layer 20322 is arranged on the same layer as the pixel defining layer 1017, and the insulation sub-layer 20323 is arranged on the same layer as the spacer 1018. Therefore, these functional layers arranged on the same layer may adopt the same material layer and be formed by the same patterning process in the fabrication process. In the above arrangement, the second intercept wall 2032 is higher than the first intercept wall 2031 so as to achieve a complete intercept effect, and the second intercept wall 2032 and the first intercept wall 2031 can jointly achieve the double intercept effect.

In an exemplary embodiment, please refer to FIG. 3B and FIG. 7C again, the crack blocking wall 204 includes a metal layer structure 204B and a lamination structure 204A; the metal layer structure 204B is located on the lamination structure 204A; and at least one side surface, surrounding the through hole 301, of the metal layer structure 204B has a notch. For example, a side surface, facing the through hole 301, of the metal layer structure 204B and a side surface, facing away from the through hole 301, of the metal layer structure 204B both have notches, namely, cases shown in FIG. 3B and FIG. 7C. In other examples, a side surface of the metal layer structure 204B may also have a notch.

For example, please refer to FIG. 7A and FIG. 7C again, three metal sub-layers 2023/2024/2025 of the at least one circle of crack detection lines 202B and three metal sub-layers 2045/2046/2047 of the crack blocking wall 204B are in one-to-one correspondence with three metal layers of the source-drain electrodes 1023 and 1024 respectively and made of the same material as the three metal layers of the source-drain electrodes. Therefore, the at least one circle of crack detection lines 202B, the crack blocking wall 204B and the source-drain electrodes 1023/1024 may adopt the same three metal material layers and be formed by the same patterning process.

For example, in some examples, the metal layer structure 204B of the crack blocking wall 204 and the at least one circle of crack detection lines 202B of the barrier wall 202 have the same structure and include the same material. Therefore, in the fabrication process of the display substrate, the metal layer structure 204B of the crack blocking wall 204 and the at least one circle of crack detection line 202B of the barrier wall 202 may be formed through the same material layer and the same patterning process so as to simplify the fabrication process of the display substrate.

For example, in some other embodiments, the metal layer structure 204B of the crack blocking wall 204 and the at least one circle of crack detection lines 202B of the barrier wall 202 have the same structure and include the same material. Similar to the above, the metal layer structure 204B of the crack blocking wall 204 may be similarly electrically connected to the first signal line 211 so as to realize crack detection of the through hole 301. That is, the crack blocking wall 204 is configured to detect a crack of the through hole 301, which is also included in the inventive concept of the present disclosure.

For example, in some other embodiments, the crack blocking wall 204 and the barrier wall 202 are jointly configured to detect the crack of the through hole 301, which is also included in the inventive concept of the present disclosure.

For example, in some embodiments, as shown in FIG. 7C, laminations of the lamination structure 204A of the crack blocking wall 204 include a first metal sub-layer 2041, a first insulation sub-layer 2042, a second metal sub-layer 2043 and a second insulation sub-layer 2044 arranged on the base substrate 1011 in sequence. For example, the first metal sub-layer 2041 is arranged on the same layer as the gate 1022, the first insulation sub-layer 2042 is arranged on the same layer as the first insulation layer 1014, the second metal sub-layer 2043 is arranged on the same layer as the second polar plate 1032, and the second insulation sub-layer 2044 is arranged on the same layer as the second insulation layer 1015. For example, structures of the barrier wall 202 and the crack blocking wall 204 may further include structures arranged on the same layers as the blocking layer 1012 and the buffer layer 1013. Therefore, these functional layers arranged on the same layer may adopt the same material layer and be formed by the same patterning process so as to simplify the fabrication process of the display substrate.

Figure 8A:
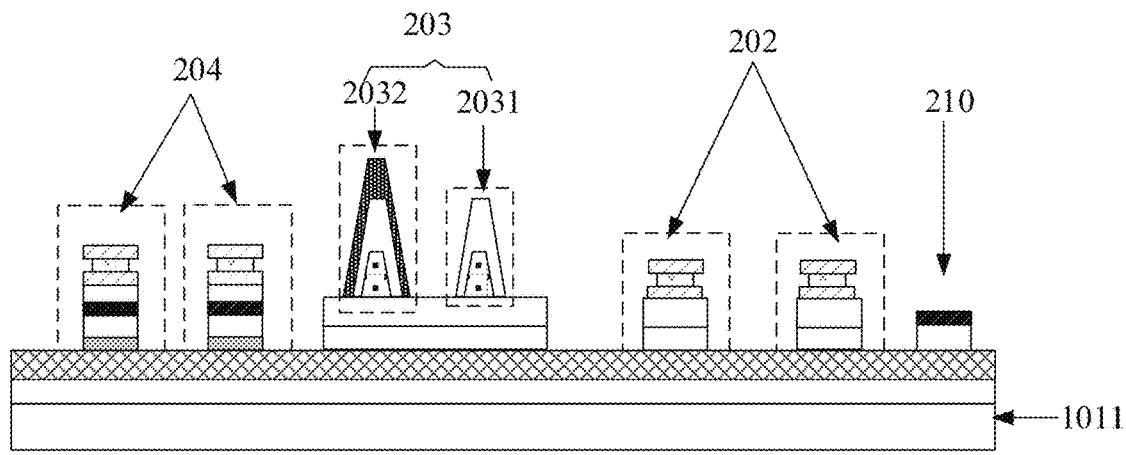
FIG. 8A is a schematic partial cross-sectional view of a display substrate provided by at least one embodiment of the present disclosure.
Figure 8B:
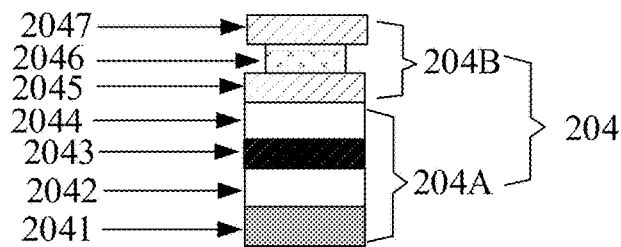
FIG. 8B is another schematic cross-sectional view of a crack blocking wall in a display substrate provided by at least one embodiment of the present disclosure.

For example, there may be various forms of the crack blocking wall 204. For example, in some examples, as shown in FIG. 8A and FIG. 8B, the first insulation sub-layer 2042 and the second insulation sub-layer 2044 of the crack blocking wall 204 may have the same pattern as the first metal sub-layer 2041 and the second metal sub-layer 2043, so it's shown in FIG. 8B that they have the same width. At the moment, in the fabrication process, the first insulation sub-layer 2042 and the second insulation sub-layer 2044 may form a corresponding pattern by a further etching process.

For example, the lamination structure 204A includes laminations with metal layers and insulation layers. The crack blocking wall 204 may disconnect the functional layers formed on the whole surface of the display substrate so as to achieve the double barrier effect together with the barrier wall 202. At the moment, even if the barrier wall 202 fails, since the crack blocking wall 204 includes the laminations with the metal layers and the insulation layers, and a vertical distance between the crack blocking wall and the base substrate 1011 is greater than a vertical distance between the barrier wall 202 and the base substrate 1011, so a barrier effect may be achieved in the crack blocking wall 204. Besides, the crack blocking wall 204 is close to the through hole 301, when the through hole 301 is formed in a mode such as stamping or cutting, the crack blocking wall 204 may also prevent expanding of the crack which is possibly generated during formation of the through hole 301, and the crack blocking wall 204 includes the laminations with the metal layers and the insulation layers, so a good crack blocking effect is achieved, and thus the crack is prevented from extending to the display region 101.

Figure 9C:
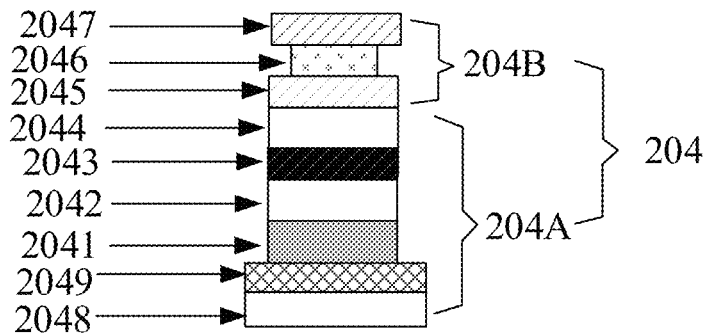
FIG. 9C is another schematic cross-sectional view of a crack blocking wall in a display substrate provided by at least one embodiment of the present disclosure.

For another example, as shown in FIG. 9A and FIG. 9C, the lamination structure 204A of the crack blocking wall 204 may also include two parts, called a third part (including the first metal sub-layer 2041, the first insulation sub-layer 2042, the second metal sub-layer 2043 and the second insulation sub-layer 2044) and a fourth part (including insulation sub-layers 2048 and 2049). For example, the fourth part is arranged on the same layers as the second part of the first multi-layer insulation layer 202A of the barrier wall, the blocking layer 1012 and the buffer layer 1013. Therefore, in the fabrication process, these functional layers arranged on the same layer may adopt the same material layer and be formed by the same patterning process. For example, a width of the third part is different from a width of the fourth part, for example, the fourth part is wider than the third part, so that a whole longitudinal section of the lamination structure 204A is a stair-step shape.

When a whole longitudinal section of the first multi-layer insulation layer 202A of the barrier wall 202 and the whole longitudinal section of the lamination structure 204A of the crack blocking wall 204 are a stair-step shape, the first inorganic encapsulation layer 1051 (introduced later) formed on the barrier wall and the crack blocking wall by, for example, deposition and other modes may be better formed along a surface morphology of the barrier wall 202 and the crack blocking wall 204 without occurring of an unfavorable condition, such as side surface breaking, so that the first inorganic encapsulation layer 1051 has better integrity, and thus a better encapsulation effect is provided.

Similarly, the width of the crack blocking wall 204 may also range from 2 μm to 4 μm, for example, 3 μm or 3.5 μm, etc. The embodiments of the present disclosure do not make a specific limitation on a size of each structure as long as corresponding functions can be achieved.

It needs to be noted that for being clear and concise, FIG. 8A and FIG. 9A only show structures of the barrier wall 202, the first intercept wall 2031, the crack blocking wall 204 and the second intercept wall 2032 and a part of the signal lines 210 on the base substrate 1011. But the display substrate may further include other structures shown in FIG. 2B, specifically, referring to FIG. 2B, which is not described in detail here.

For example, as shown in FIG. 2B and FIG. 2C, the display substrate 100 may further include an encapsulation layer 105, and the encapsulation layer 105 at least encapsulates the barrier wall 202. For example, in some examples, the encapsulation layer 105 encapsulates the display region 101 (including the plurality of sub-pixels) and the barrier wall 202 at the same time.

For example, the encapsulation layer 105 includes a first inorganic encapsulation layer 1051, a first organic encapsulation layer 1052 and a second inorganic encapsulation layer 1053 sequentially arranged in stack on the barrier wall 202. For example, the first inorganic encapsulation layer 1051 is formed on a whole surface of the display substrate, and due to the intercept effect of the first intercept wall 2031, the first organic encapsulation layer 1052 and the second inorganic encapsulation layer 1053 end at the first intercept wall 2031.

For example, in some embodiments, as shown in FIG. 2A and FIG. 2B, the display substrate 100 may further include: an image sensor and/or infrared sensor 501. The image sensor and/or infrared sensor 501 is combined with a non-display side of the display substrate 100, and an orthographic projection of the image sensor and/or infrared sensor on the base substrate 1011 at least partially overlaps with the through hole 301. Therefore, the image sensor and/or infrared sensor 501 can realize various functions, such as photographing, face recognition, infrared sensing and the like via the through hole 301.

In the display substrate provided by the embodiments of the present disclosure, the barrier region 201 may fully isolate the display region 101 from the through hole 301, so that the impurities such as water and oxygen can be effectively prevented from entering the display region 101 from the through hole 301, and the crack possibly generated during formation of the through hole 301 can also be prevented from expanding to the display region 101, so as to effectively prevent the impurities such as water and oxygen from entering the display region of the display substrate from the through hole. At least a part of the drive structure layer of the barrier region is multiplexed as the crack detection line, so an area of a non-display region is not increased due to arrangement of the crack detection line, and maximization of the display region of the display substrate is guaranteed. Crack detection of the through hole is realized through electrical connection of the shift register circuit, the first signal line and the at least one circle of crack detection lines in the barrier region.

At least one embodiment of the present disclosure further provides a fabrication method of a display substrate. Taking formation of a display substrate 100 shown in FIG. 4A to FIG. 4B as an example below, only two barrier walls 202 and one crack blocking wall 204 are exemplarily shown to introduce the fabrication method of the display substrate provided by the embodiments of the present disclosure.

Firstly, a base substrate 1011 is provided, for example, when the display substrate 100 is a flexible display substrate, the provided base substrate 1011 may be a flexible substrate made of polyimide (PI) and the like; and when the display substrate is a rigid substrate, the base substrate 1011 may be a rigid substrate made of glass, quartz and the like.

Figure 10A:
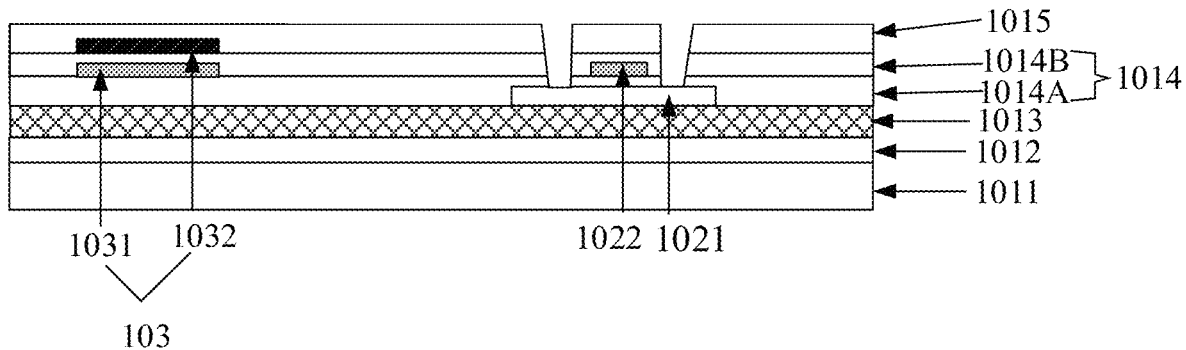
FIGS. 10A-FIG. 10C, FIGS. 11A-FIG. 11B, FIGS. 12A-FIG. 12B, FIGS. 13A-FIG. 13B and FIGS. 14A-FIG. 14B are schematic cross-sectional views in a fabrication process of a display substrate provided by at least one embodiment of the present disclosure.
Figure 10B:
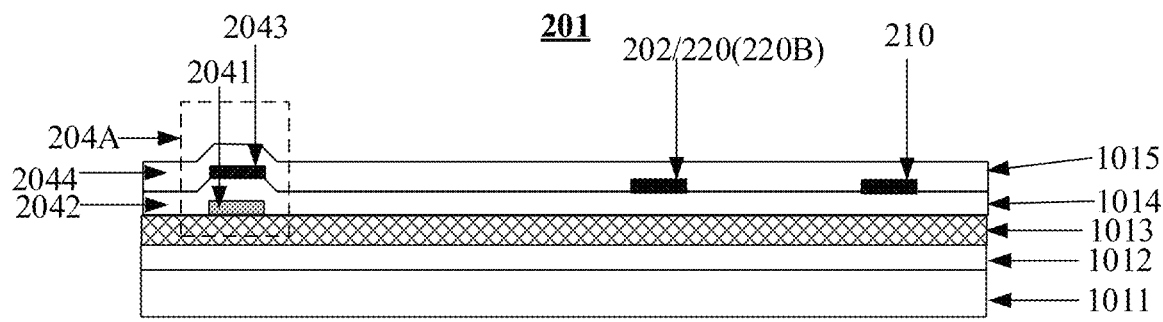

As shown in FIG. 10A to FIG. 10B, firstly, functional layers used for the display region 101 and the barrier region 201 are formed on the base substrate 1011, and a position is reserved for a through hole 301, so that the through hole 301 may be formed in a mode such as stamping or cutting after formation of the functional layers of the display region 101 and the barrier region 201 is completed.

For example, a blocking layer 1012 and a buffer layer 1013 may be formed on the base substrate 1011 in sequence in a mode such as deposition. For example, the blocking layer 1012 and the buffer layer 1013 may be formed on a whole surface of the base substrate 1011. For example, the blocking layer 1012 may adopt an inorganic insulation material such as silicon oxide, silicon nitride, or silicon oxynitride; and the buffer layer 1013 may also adopt the inorganic insulation material such as silicon oxide, silicon nitride, or silicon oxynitride.

For example, after the blocking layer 1012 and the buffer layer 1013 are formed, as shown in FIG. 10A, structures such as a thin-film transistor 102 and a storage capacitor 103 are formed in the display region 101. As shown in FIG. 10B, a lamination structure 204A of the crack blocking wall 204 as well as at least a part of lap joint structures 220 and a plurality of signal lines 210 are formed in a barrier region 201.

Figure 10C:
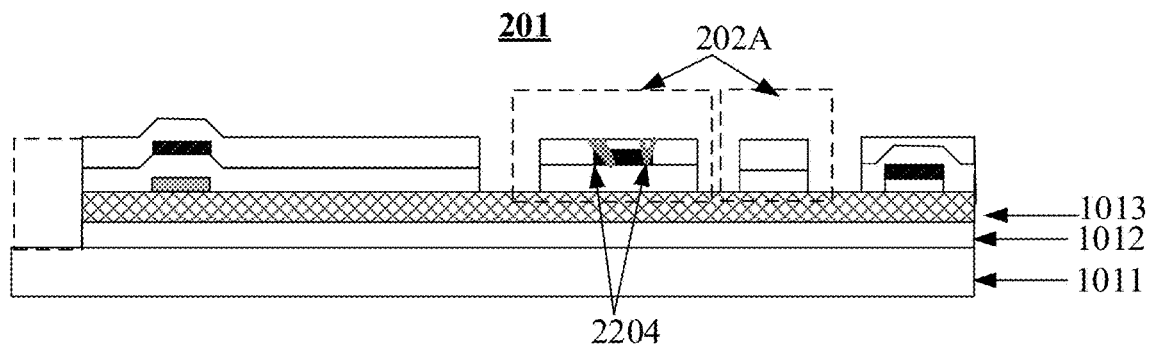

For example, as shown in FIG. 10A to FIG. 10C, an active layer 1021 is formed on the base substrate 1011 through a patterning process; a first insulation layer 1014A is formed on the active layer 1021 through deposition and other modes; a gate 1022, a first polar plate 1031 and a first metal sub-layer 2041 are formed on the first insulation layer 1014A at the same time by using a patterning process; a second insulation layer 1014B is formed on the gate 1022, the first polar plate 1031 and the first metal sub-layer 2041 through deposition and other modes; a second polar plate 1032 and a second metal sub-layer 2043 as well as at least a part of lap joint structures 220 and a plurality of signal lines 210 arranged on the same layer with the same material are formed at the same time by using a patterning process; a second insulation layer 1015 is formed on the second polar plate 1032 and the second metal sub-layer 2043 through deposition and other modes; and then the first insulation layer 1014 and the second insulation layer 1015 are etched to form a via hole exposing the active layer 1021 and form a via hole 2204 exposing the lap joint structure 220 and located on the second metal sub-layer 2043. For example, a single patterning process includes formation of photoresist, exposure, developing, etching and other processes.

At the moment, the first metal sub-layer 2041 of the crack blocking wall 204 and the gate 1022 are formed on the same layer; the first insulation sub-layer 2042 and the first insulation layer 1014 are formed on the same layer; the second metal sub-layer 2043, the lap joint structure 220, the signal lines 210 and the second polar plate 1032 are formed on the same layer; and the second insulation sub-layer 2044 and the second insulation layer 1015 are formed on the same layer. Therefore, the fabrication process of the display substrate is simplified.

For example, materials of the gate 1022, the first polar plate 1031 and the first metal sub-layer 2041 include aluminum, titanium, cobalt and other metal or an alloy material. During fabrication, firstly, a gate material layer is formed through sputtering or evaporation and the like, and then a patterning process is performed on the gate material layer so as to form a patterned gate 1022, a first polar plate 1031 and a first material sub-layer 2041. A forming mode of other structures formed on the same layer is similar to this and will not be repeated.

For example, the active layer 1021 may adopt materials such as polycrystalline silicon and metal oxides; the first insulation layer 1014 may adopt an inorganic insulation material such as silicon oxide, silicon nitride or silicon oxynitride; the second polar plate 1032, the second metal sub-layer 2043, the lap joint structure 220 and the signal lines 210 may adopt aluminum, titanium, cobalt and other metal or an alloy material; and the second insulation layer 1015 may adopt the inorganic insulation material such as silicon oxide, silicon nitride or silicon oxynitride. The embodiments of the present disclosure do not make limitation on a material of each functional layer, and the material of each functional layer is not limited to the above example.

For example, as shown in FIG. 10C, the first insulation layer 1014 and the second insulation layer 1015 in a barrier region 201 may be etched by using a single etching process, to form a first multi-layer insulation layer 202A of the barrier wall 202 and generate a via hole at the lap joint structure 220 so as to form a via hole 2204 exposing the lap joint structure 220. Therefore, the first multi-layer insulation layer 202A includes an insulation sub-layer 2021 formed on the same layer as the first insulation layer 1014 and an insulation sub-layer 2022 formed on the same layer as the second insulation layer 1015.

At the moment, the first multi-layer insulation layer 202A and the via hole 2204 exposing the lap joint structure 220 are formed on the same layers as the first insulation layer 1014 and the second insulation layer 1015, so that the fabrication process of the display substrate is simplified.

For example, in another embodiment, by the fabrication method of the display substrate, the barrier wall 202 shown in FIG. 9B and the crack blocking wall 204 shown in FIG. 9C may also be formed. At the moment, the first insulation layer 1014 and the second insulation layer 1015 of the barrier region 201 may be etched through a first etching process, and the blocking layer 1012 and the buffer layer 1013 of the barrier region 201 are etched through a second etching process, so that the first multi-layer insulation layer 202A including a first part (including the insulation sub-layers 2021 and 2022) and a second part (including insulation sub-layers 2026 and 2027) and a lamination structure 204A including a third part (including the first metal sub-layer 2041, the first insulation sub-layer 2042, the second metal sub-layer 2043 and the second insulation sub-layer 2044) and a fourth part (including insulation sub-layers 2048 and 2049) are formed.

Therefore, the first part of the first multi-layer insulation layer 202A and the insulation sub-layers in the third part of the lamination structure 204A are formed on the same layers as the first insulation layer 1014 and the second insulation layer 1015; and the second part of the first multi-layer insulation layer 202A and the fourth part of the lamination structure 204A are formed on the same layers as the blocking layer 1012 and the buffer layer 1013. A total thickness of the blocking layer 1012, the buffer layer 1013, the first insulation layer 1014 and the second insulation layer 1015 is large, a part of them is etched through the etching process twice respectively so as to facilitate smooth performing of the etching process, and guaranteeing a final etching morphology.

As shown in FIG. 10C, in the above etching process, parts (namely, parts represented by a dotted line frame on a left side in FIG. 10C) of the blocking layer 1012, the buffer layer 1013, the first insulation layer 1014 and the second insulation layer 1015 close to the through hole 301 may be also etched at the same time. A part or all of the blocking layer 1012, the buffer layer 1013, the first insulation layer 1014 and the second insulation layer 1015 are made of the inorganic insulation material; the inorganic insulation material is brittle; and a crack is prone to occurring during formation of the through hole 301 by using a mode such as stamping or cutting, so the parts of the blocking layer 1012, the buffer layer 1013, the first insulation layer 1014 and the second insulation layer 1015 close to the through hole 301 are removed, so that a crack can be prevented from being formed in these layers during formation of the through hole 301.

Figure 11A:
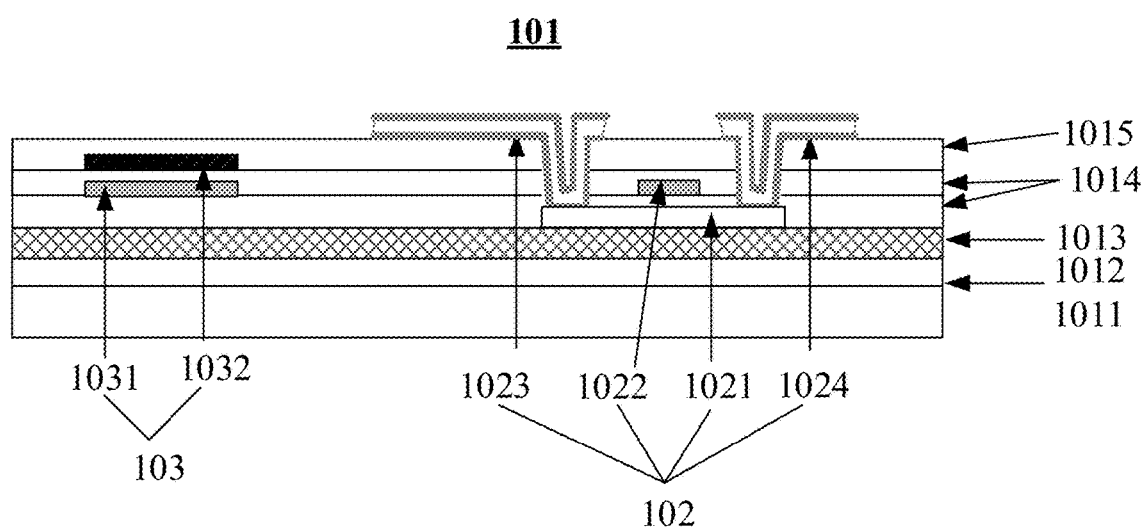
Figure 11B:
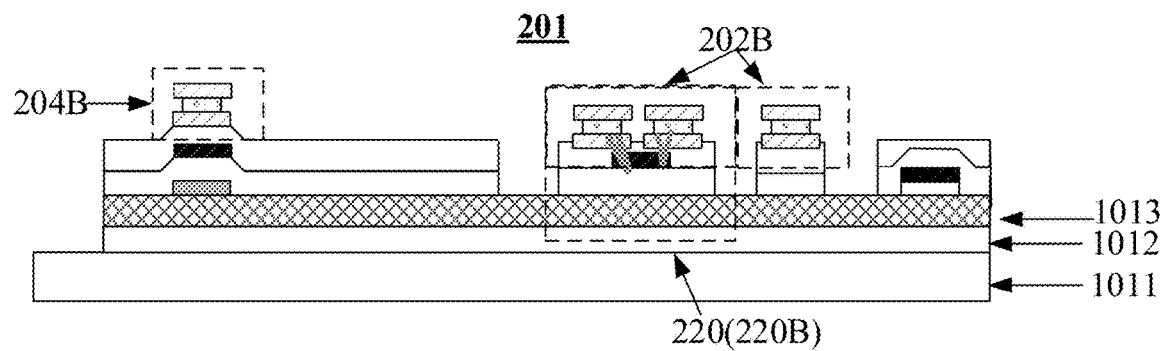

As shown in FIG. 11A and FIG. 11B, after a via hole in the second insulation layer 1015 is formed, the source 1024, the drain 1023, at least one circle of crack detection lines 202B of the barrier wall 202 and a metal layer structure 204B of the crack blocking wall 204 are formed. At least a part of the source 1024 and drain 1023 in the barrier wall 202 is electrically connected to a part of the lap joint structure located in the second polar plate at the via hole 2204 of the lap joint structure 220, so that lap joint is realized. That is, the lap joint structure 220 (including a first lap joint structure 220A and a second lap joint structure 220B) includes the second metal sub-layer 2043 (on the same layer and with the same material as the second polar plate 1032), and a source-drain electrode layer (including the source 1024 and the drain 1023), both of which are electrically connected through a via hole. Similarly, the lap joint structure may also include the first metal sub-layer 2041 (the first polar plate 1031) and a source-drain electrode layer, both of which are electrically connected to though a via hole.

For example, the source 1024 and the drain 1023 may be formed as a multi-layer metal structure, for example, a three-layer metal layer structure. For example, in an example, a titanium material layer, an aluminum material layer and a titanium material layer may be formed in sequence through sputtering or evaporation, etc., and then thee three material layers are patterned by using a single patterning process at the same time, so that a three-layer metal structure of titanium/aluminum/titanium constituting the source 1024 and the drain 1023 is formed, and meanwhile, at least one circle of initial crack detection lines and an initial metal layer structure of which side surfaces are flush are formed at the same time. Then the at least one circle of initial crack detection lines and the initial metal layer structure of which side surfaces are flush are etched through a single etching process, so as to form at least one circle of crack detection lines 202B and a metal layer structure 204B with notches on side surfaces. For example, etchant used in the etching process has an etching effect only on a middle layer of the at least one circle of crack detection lines 202B and the metal layer structure 204B, or an etching rate on the middle layer is greater than an etching rate on other layers, so that the notches of the at least one circle of crack detection lines 202B and the metal layer structure 204B can be formed by the etching process.

Therefore, the source 1024 and the drain 1023, as well as the at least one circle of crack detection lines 202B of the barrier wall 202 are formed on the same layers as the metal layer structure 204B of the crack blocking wall 204 and the lap joint structure 220; and the fabrication process of the display substrate is simplified.

Figure 12A:
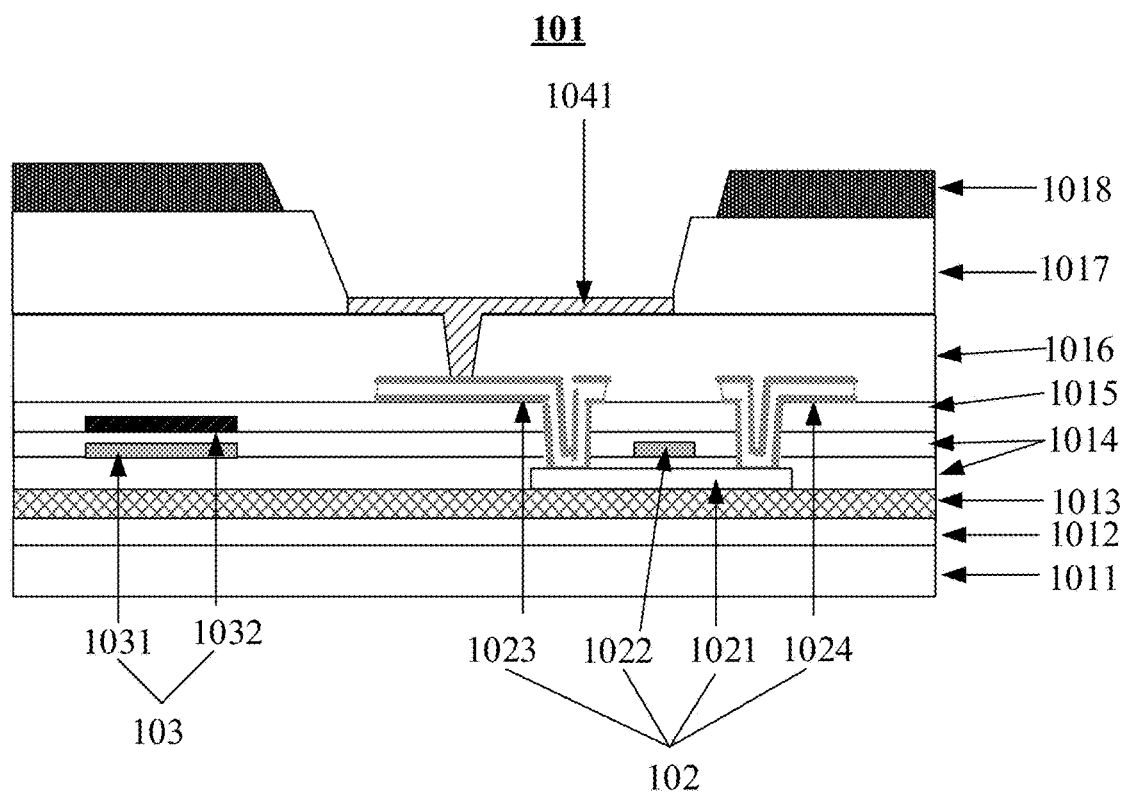
Figure 12B:
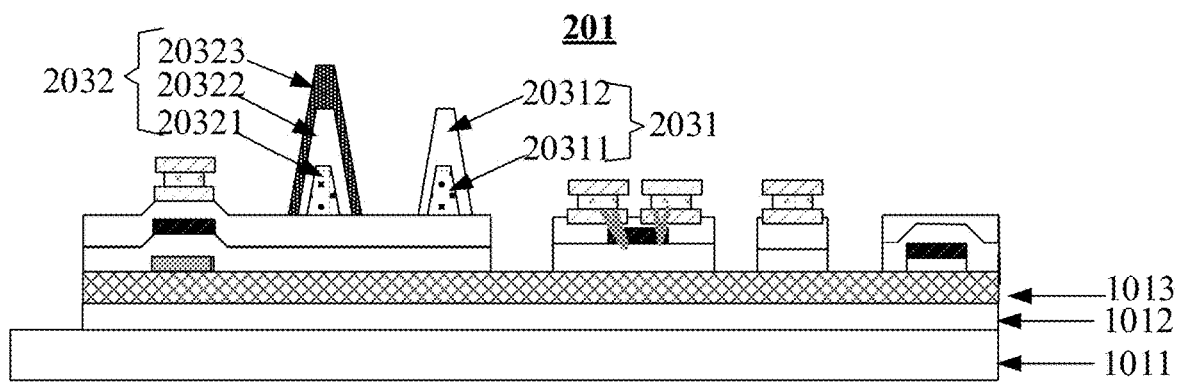

As shown in FIG. 12A and FIG. 12B, after formation of all film layers of the thin-film transistor 102 and the storage capacitor 103 is completed, a planarization layer 1016, an anode layer 1041, a pixel defining layer 1017 and a spacer 1018 are formed in sequence; and a first intercept wall 2031 and a second intercept wall 2032 are formed at the same time.

For example, the planarization layer 1016, an insulation sub-layer 20311 of the first intercept wall 2031 and an insulation sub-layer 20321 of the second intercept wall 2032 are formed on the same layer through a patterning process. For example, the materials of the planarization layer 1016, the insulation sub-layer 20311 of the first intercept wall 2031 and the insulation sub-layer 20321 of the second intercept wall 2032 may be an organic insulation material such as polyimide and epoxy resin. A via hole is formed in the formed planarization layer 1016, so that the anode layer 1041 formed afterwards is electrically connected to the drain 1023 through the via hole.

For example, the anode layer 1041 is formed on the planarization layer 1016 of the display region 101 through a patterning process, and the anode layer 1041 is electrically connected to the drain 1023 through the via hole in the planarization layer 1016. For example, a material of the anode layer 1041 includes indium tin oxide (ITO), indium zinc oxide (IZO) and other metal oxides or Ag, Al, Mo and other metal or their alloy.

For example, the pixel defining layer 1017, the insulation sub-layer 20312 of the first intercept wall 2031 and the insulation sub-layer 20322 of the second intercept wall 2032 are formed on the same layer through a patterning process. An opening for exposing the anode layer 1041 is formed in the pixel defining layer 1017, so that structures such as an organic functional layer 1042 and a cathode layer 1043 of a light-emitting device can be formed afterwards. For example, the materials of the pixel defining layer 1017, the insulation sub-layer 20312 of the first intercept wall 2031 and the insulation sub-layer 20322 of the second intercept wall 2032 may include the organic insulation material such as polyimide and epoxy resin.

For example, the spacer 1018 and the insulation sub-layer 20323 of the second intercept wall 2032 are formed on the same layer through the patterning process. Materials of the spacer 1018 and the insulation sub-layer 20323 of the second intercept wall 2032 include the organic insulation material such as polyimide and epoxy resin. At the moment, the quantity of the insulation sub-layers of the second intercept wall 2032 is greater than the quantity of the insulation sub-layers of the first intercept wall 2031, so the second intercept wall 2032 is higher than the first intercept wall 2031.

In the above examples, the first intercept wall 2031 is formed on the same layers as the planarization layer 1016 and the pixel defining layer 1017; and the second intercept wall 2032 is formed on the same layers as the planarization layer 1016, the pixel defining layer 1017 and the spacer 1018, so that the fabrication process of the display substrate is simplified. For example, in other examples, the second intercept wall 2032 may also be formed on the same layers as the planarization layer 1016 and the spacer 1018, or formed on the same layers as the pixel defining layer 1017 and the spacer 1018, which is not limited by the embodiments of the present disclosure.

Figure 13A:
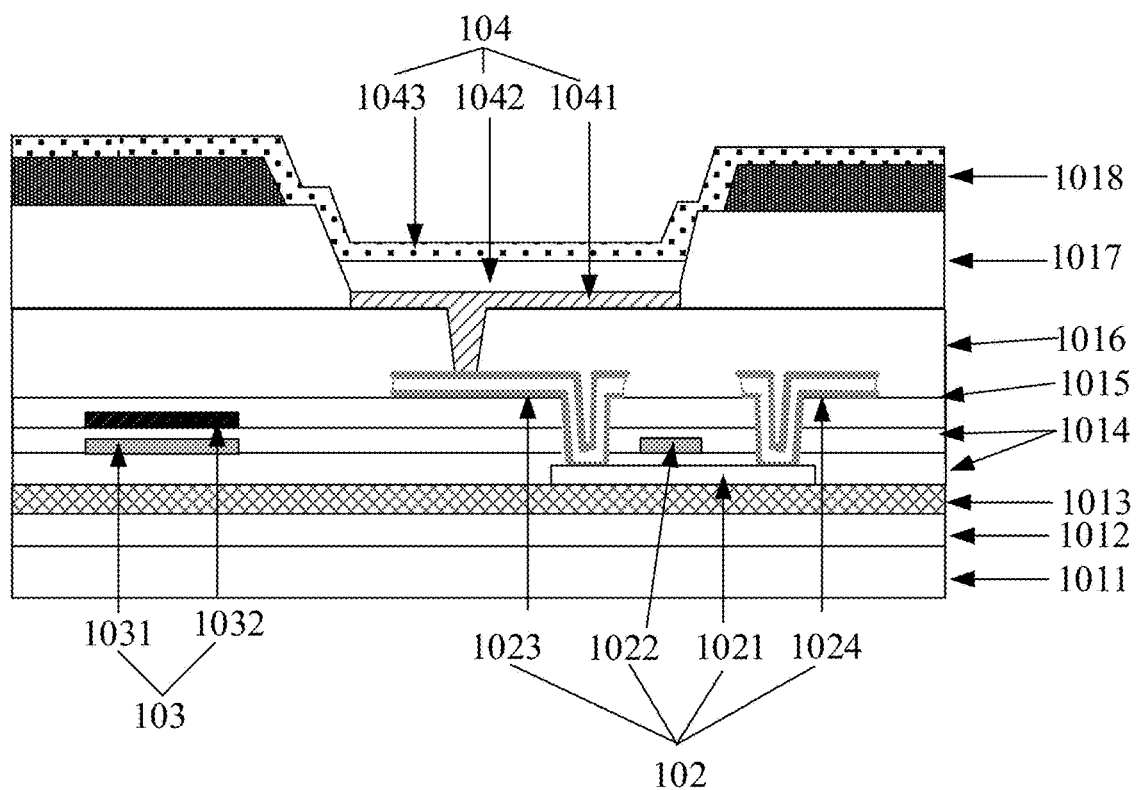
Figure 13B:
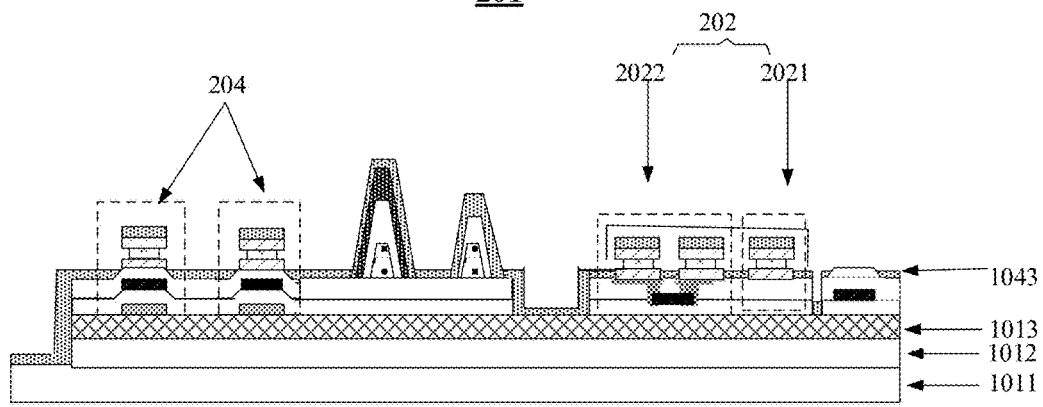

For example, as shown in FIG. 13A and FIG. 13B, an organic functional layer 1042 may be formed in the opening of the pixel defining layer 1017 through ink-jet printing or evaporation, etc., and then the cathode layer 1043 is formed. For example, an auxiliary light-emitting layer (not shown) may also be formed between the organic functional layer 1042 and the anode layer 1041 or between the organic functional layer 1042 and the cathode layer 1043; and the auxiliary light-emitting layer includes, for example, one or more of an electron injection layer, an electron transport layer, a hole injection layer and a hole transport layer. The cathode layer 1043 and the auxiliary light-emitting layer are, for example, formed on a whole surface of the display substrate and are disconnected at the barrier wall 202 and the crack blocking wall 204.

For example, a material of the organic functional layer 1042 and a material of the auxiliary light-emitting layer are organic materials, and the material of the organic functional layer 1042 may select a light-emitting material capable of emitting light with a certain color (for example, red light, blue light or green light and the like) according to demands. The material of the cathode layer 1043 may include Mg, Ca, Li, or Al and other metal or their alloy, or IZO, zinc tin oxide (ZTO) and other metal oxides, or PEDOT/PSS (poly(3,4-ethylenedioxythiophene)/poly(styrenesulfonate)) and other organic material with a conductive performance.

At the moment, when parts, close to the through hole 301, of the cathode layer 1043 and the organic functional layer 1042 are contaminated, since the cathode layer 1043 and the organic functional layer are disconnected by the barrier wall 202 and the crack blocking wall 204, impurities such as water and oxygen cannot be spread and cannot extend to parts of the cathode layer 1043 and the organic functional layer for emitting light.

Figure 14A:
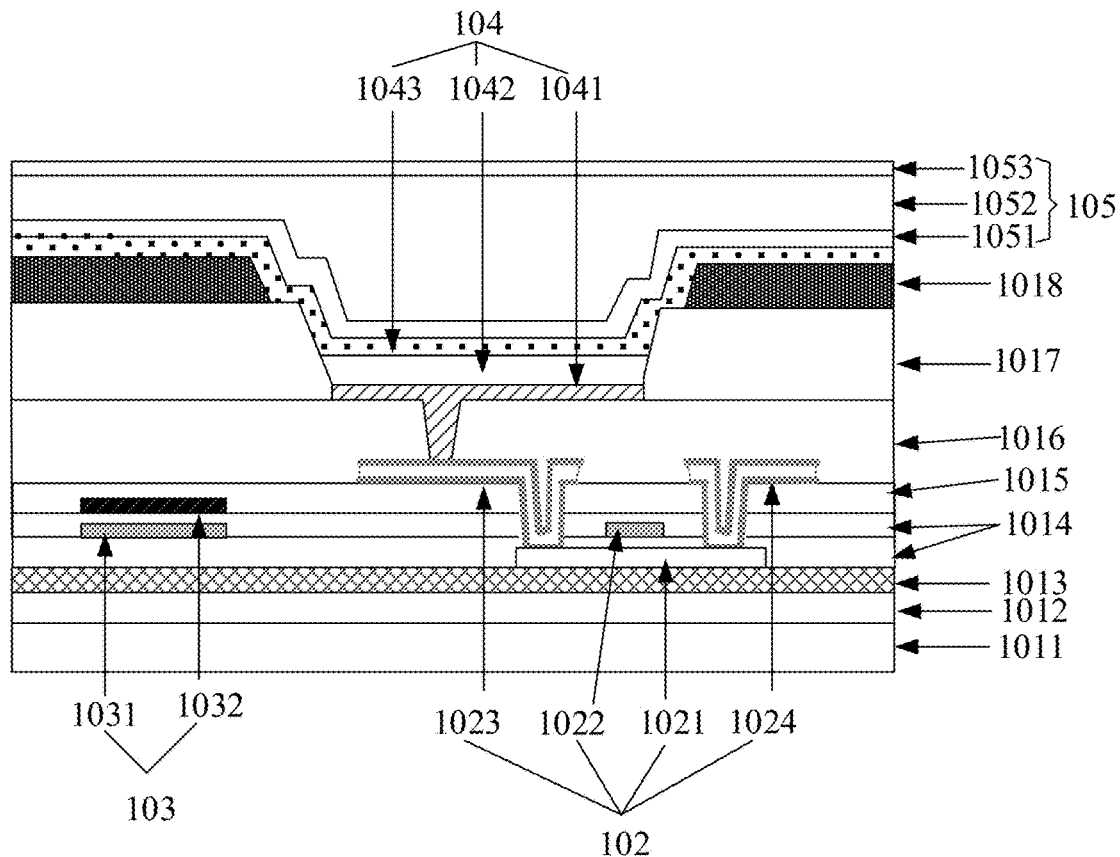
Figure 14B:
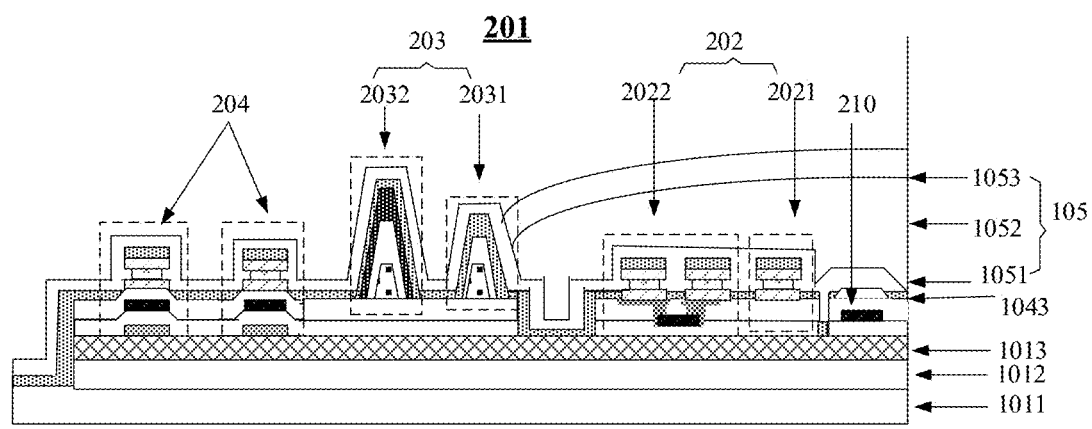

As shown in FIG. 14A to FIG. 14B, after the light-emitting device 104 is formed, an encapsulation layer 105 may be formed in the display region 201 and on the barrier wall 202. For example, forming the encapsulation layer 105 includes forming a first inorganic encapsulation layer 1051, a first organic encapsulation layer 1052 and a second inorganic encapsulation layer 1053 on the barrier wall 202 and in the display region 201 in sequence. For example, the first inorganic encapsulation layer 1051 and the second inorganic encapsulation layer 1053 are formed through deposition, etc. The first organic encapsulation layer 1052 is formed through a mode of ink-jet printing. As shown in FIG. 14B, due to a intercept effect of the first intercept wall 2031, the first organic encapsulation layer 1052 ends at the first intercept wall 2031.

For example, the first inorganic encapsulation layer 1051 and the second inorganic encapsulation layer 1053 may be formed by using an inorganic material such as silicon nitride, silicon oxide and silicon oxynitride, and the first organic encapsulation layer 1052 may be formed by using the organic material such as polyimide (PI) and epoxy resin. Therefore, the first inorganic encapsulation layer 1051, the first organic encapsulation layer 1052 and the second inorganic encapsulation layer 1053 are formed as a combined encapsulation layer, the combined encapsulation layer may form multiple protection for structures such as a functional structure of the display region 201 and the barrier wall 202, and a better encapsulation effect is achieved.

In some embodiments of the present disclosure, according to demands, other necessary functional film layers may further be formed in the display region 101 and the barrier region 201, and these film layers may be formed by using a conventional method, which is not described in detail here.

For example, after formation of the display region 101 is completed, the through hole 301 may be formed by using laser cutting or mechanical stamping, etc. The through hole 301 penetrates through the base substrate 1011, structures such as an image sensor and an infrared sensor may be installed at the through hole 301, by which signal connection with a central processing unit and the like is performed. For example, the image sensor or the infrared sensor and other structures may be arranged on a side (namely, a non-display side of the display substrate), away from the light-emitting device, of the base substrate 1011; and can achieve various functions, such as photographing, face recognition, infrared sensing and the like, via the through hole 301.

For example, after the through hole 301 is formed, structures such as a polarizer and a cover plate may be formed on the display substrate, which is not limited by the embodiments of the present disclosure.

According to the display substrate formed by the fabrication method provided by the embodiments of the present disclosure, a camera apparatus and the display region of the display substrate are combined, a height difference is formed by using the organic functional layer and at least a part of a drive structure layer of the display region, so as to form the barrier region, the organic functional layer is isolated from the through hole, the impurities such as water and oxygen can be effectively prevented from entering the display region of the display substrate from the through hole, and thus reliability of the display substrate can be improved. Crack detection of the through hole can be realized through electrical connection of the shift register circuit, the first signal line and the at least one circle of crack detection lines in the barrier region. At least a part of the drive structure layer is multiplexed as the crack detection line, so an area of a non-display region is not increased due to arrangement of the crack detection line, and maximization of the display region of the display substrate is guaranteed.

The display substrate provided by the embodiments of the present disclosure or the display substrate obtained by the fabrication method provided by the embodiments of the present disclosure may be applied to a display apparatus, the display apparatus may be a mobile phone, a tablet computer, a TV, a display, a notebook computer, a digital photo frame, a navigator and any product or component with a display function, which is not limited by the embodiments of the present disclosure.

The following several points need to be noted.

(1) The accompanying drawings of the embodiments of the present disclosure only involve structures which the embodiments of the present disclosure involve, and other structures may refer to a general design.

(2) For being clear, in the accompanying drawings for describing the embodiments of the present disclosure, a thickness of a layer or a region is scaled up or down, that is, these drawings are not drawn according to an actual scale. It can be understood that when an element such as a layer, a film, a region or a substrate is termed as being located "on" or "below" another element, the element may be "directly" located "on" or "below" the another element, or there may be a middle element.

(3) Without a conflict, the embodiments and features in the embodiments of the present disclosure may be combined to obtain a new embodiment.

The above description is only specific implementations of the present disclosure, the protection scope of the present disclosure is not limited to this, any of those skill persons knowing the technical field very well can easily figure out changes or replacements within the technical scope disclosed by the present disclosure, which is supposed to all fall within the protection scope of the present disclosure. Therefore, the protection scope of the present disclosure should refer to the protection scope of the claims as standard.

What is claimed is:

1. A display substrate, comprising:
 a base substrate, comprising a display region, a peripheral region and a barrier region;
 wherein the peripheral region surrounds the display region, and the display region surrounds the barrier region;
 a through hole, arranged in the barrier region; wherein a center of the display substrate does not coincide with a center of the through hole;
 a plurality of sub-pixels, arranged in the display region;
 a plurality of signal lines, arranged in the display region, the peripheral region and the barrier region; wherein the plurality of signal lines are electrically connected to the plurality of sub-pixels; wherein the plurality of signal lines comprise a first signal line;
 a shift register circuit, arranged in the peripheral region and electrically connected to the plurality of signal lines; and
 at least one circle of crack detection lines, arranged in the barrier region and surrounding the through hole; wherein the at least one circle of crack detection lines are electrically connected to the first signal line, and the first signal line is electrically connected to at least one sub-pixel in the plurality of sub-pixels;
 wherein the barrier region further comprises a barrier wall, at least one circle of intercept wall and at least one circle of crack blocking wall arranged in sequence in a direction from the display region to the through hole;
 wherein the at least one circle of crack detection lines forms at least a part of the barrier wall.

2. The display substrate according to claim 1, wherein the shift register circuit comprises a plurality of shift register units, and the first signal line is electrically connected to one of the plurality of shift register units.

3. The display substrate according to claim 2, wherein the shift register circuit is a gate shift register circuit, and the first signal line is a scanning signal line; or
 the shift register circuit is a light-emitting control shift register circuit, and the first signal line is a light-emitting control signal line.

4. The display substrate according to claim 1, further comprising at least one first lap joint structure;
 wherein the first signal line is electrically connected to the at least one circle of crack detection lines through the at least one first lap joint structure, and the at least one first lap joint structure and the at least one circle of crack detection lines are arranged on different layers and electrically connected through a via hole.

5. The display substrate according to claim 4, wherein a quantity of first lap joint structures is two;
the first signal line comprises a first routing sub-wire and a second routing sub-wire; and
one of the two first lap joint structures is electrically connected to the first routing sub-wire and a first end of the at least one circle of crack detection lines, and the other is electrically connected to the second routing sub-wire and a second end of the at least one circle of crack detection lines.

6. The display substrate according to claim 1, wherein a quantity of circles of crack detection lines is multiple, and the multiple circles of crack detection lines are continuous routing wires and surround the through hole.

7. The display substrate according to claim 6, further comprising at least one second lap joint structure;
wherein two adjacent circles of crack detection lines are electrically connected to each other through the at least one second lap joint structure, and
the at least one second lap joint structure and the two adjacent circles of crack detection lines are arranged on different layers and electrically connected through a via hole.

8. The display substrate according to claim 7, wherein the quantity of circles of crack detection lines is four;
the crack detection lines respectively comprise a first detection routing sub-wire, a second detection routing sub-wire, a third detection routing sub-wire and a fourth detection routing sub-wire in a radial direction approaching the center of the through hole;
the first detection routing sub-wire and the second detection routing sub-wire are electrically connected through one second lap joint structure; and
any two of the second detection routing sub-wire, the third detection routing sub-wire and the fourth detection routing sub-wire are electrically connected through two second lap joint structures.

9. The display substrate according to claim 1, further comprising a first multi-layer insulation layer arranged on a side of the base substrate,
wherein the at least one circle of crack detection lines are arranged on a side, away from the base substrate, of the first multi-layer insulation layer.

10. The display substrate according to claim 9, further comprising:
a first organic functional layer located on a side, away from the base substrate, of the at least one circle of crack detection lines; and
a second organic functional layer located on a side, away from the base substrate, of the first multi-layer insulation layer;
wherein the first organic functional layer and the second organic functional layer are arranged intermittently; and
an orthographic projection of the first organic functional layer on the base substrate does not overlap with an orthographic projection of the second organic functional layer on the base substrate.

11. The display substrate according to claim 10, wherein at least one of the plurality of sub-pixels comprises: a thin-film transistor, a storage capacitor and a light-emitting device;
wherein the thin-film transistor comprises:
an active layer, arranged on the base substrate;
a gate, arranged on a side, away from the base substrate, of the active layer;
a first insulation layer, arranged on a side, away from the base substrate, of the gate;
a second insulation layer, arranged on a side, away from the base substrate, of the first insulation layer; and
a source and a drain, arranged on a side, away from the base substrate, of the second insulation layer and electrically connected to the active layer;
wherein the storage capacitor comprises:
a first polar plate, arranged on a same layer as the gate; and
a second polar plate, arranged between the first insulation layer and the second insulation layer;
wherein the light-emitting device comprises:
an anode layer, arranged on a side, away from the base substrate, of the source and the drain;
an organic functional layer, arranged on a side, away from the base substrate, of the anode layer; and
a cathode layer, arranged on a side, away from the base substrate, of the organic functional layer.

12. The display substrate according to claim 11, wherein the at least one circle of crack detection lines and the source or the drain are arranged on a same layer;
the first multi-layer insulation layer at least comprises the first insulation layer and the second insulation layer; and
a second lap joint structure and a first lap joint structure are arranged on a same layer as the second polar plate;
wherein materials of the first organic functional layer and the second organic functional layer are same.

13. The display substrate according to claim 11, further comprising at least one groove;
wherein the at least one groove penetrates through the first insulation layer and at least a part of the second insulation layer; and
an orthographic projection of the at least one groove on the base substrate does not overlap with an orthographic projection of the at least one circle of crack detection lines on the base substrate.

14. The display substrate according to claim 9, wherein the at least one circle of crack detection lines comprise a first sub-layer, a second sub-layer and a third sub-layer sequentially arranged on a side, away from the base substrate, of the first multi-layer insulation layer; and
an orthographic projection of the second sub-layer on the base substrate is located in orthographic projections of the first sub-layer and the third sub-layer on the base substrate.

15. The display substrate according to claim 9, wherein at least one side surface of the at least one circle of crack detection lines surrounding the through hole has a notch.

16. The display substrate according to claim 9, wherein the at least one circle of intercept wall is arranged in a direction of the at least one circle of crack detection lines approaching the through hole;
wherein the at least one circle of intercept wall is configured to block an organic encapsulation layer for encapsulating the plurality of sub-pixels.

17. The display substrate according to claim 16, wherein the at least one circle of intercept wall comprises a first intercept wall and a second intercept wall;
the first intercept wall is arranged on a side, away from the through hole, of the second intercept wall; and
a largest height of the first intercept wall in a direction perpendicular to the base substrate is smaller than a largest height of the second intercept wall in the direction perpendicular to the base substrate.

18. The display substrate according to claim 9, further comprising an encapsulation layer;
- wherein the encapsulation layer at least encapsulates the barrier wall; and
- the encapsulation layer comprises a first inorganic encapsulation layer, a first organic encapsulation layer and a second inorganic encapsulation layer sequentially arranged on the at least one circle of crack detection lines in stack.

19. A display apparatus, comprising the display substrate according to claim 1 and further comprising: an image sensor and/or an infrared sensor;
- wherein the image sensor and/or the infrared sensor is combined with the base substrate, and
- an orthographic projection of the image sensor and/or the infrared sensor on the base substrate at least partially overlaps with the through hole.

\* \* \* \* \*